(12) United States Patent
Umezawa

(10) Patent No.: US 6,961,268 B2
(45) Date of Patent: Nov. 1, 2005

(54) NONVOLATILE SEMICONDUCTOR MEMORY DEVICE WITH MOS TRANSISTORS EACH HAVING A FLOATING GATE AND A CONTROL GATE

(75) Inventor: Akira Umezawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 10/750,812

(22) Filed: Jan. 5, 2004

(65) Prior Publication Data

US 2005/0047213 A1    Mar. 3, 2005

(30) Foreign Application Priority Data

Aug. 28, 2003  (JP)  ............................ 2003-209312

(51) Int. Cl.[7] ............................................. G11C 16/04
(52) U.S. Cl. ............................. 365/185.28; 365/185.01
(58) Field of Search ...................... 365/185.28, 189.01, 365/189.04, 185.01, 185.26

(56) References Cited

U.S. PATENT DOCUMENTS

| | | | |
|---|---|---|---|
| 5,592,001 A  * | 1/1997 | Asano ................... | 365/185.05 |
| 6,222,774 B1 | 4/2001 | Tanzawa et al. | |
| 6,373,749 B1 | 4/2002 | Atsumi et al. | |
| 2004/0212008 A1 * | 10/2004 | Hasegawa ................... | 257/316 |

OTHER PUBLICATIONS

Wei-Hua Liu et al, "A2-Transistor Source-select (2TS) Flash EEPROM for 1.8V-Only Applications," Non-volatile Semiconductor Workshop 4.1, Feb. 1997.

* cited by examiner

Primary Examiner—Thong Q. Le
(74) Attorney, Agent, or Firm—Oblon, Spivak, McClelland, Maier & Neustadt, P.C.

(57) ABSTRACT

A semiconductor memory device includes memory cells, a memory cell array, word lines, select gate lines, first and second row decoders, and a control circuit. The memory cell includes a first MOS transistor with a stacked gate formed on a first well region and a second MOS transistor having a drain connected to a source of the first MOS transistor. The word line connects in common control gates of the first MOS transistors. The select gate line connects in common gates of the second MOS transistors. The first row decoder in a write operation, applies a positive and negative potentials to the selected word line and the first well region, respectively and after the write operation, brings the selected word line and the first well region into a floating state. The control circuit short-circuits the selected word line and first well region in the floating state.

19 Claims, 27 Drawing Sheets

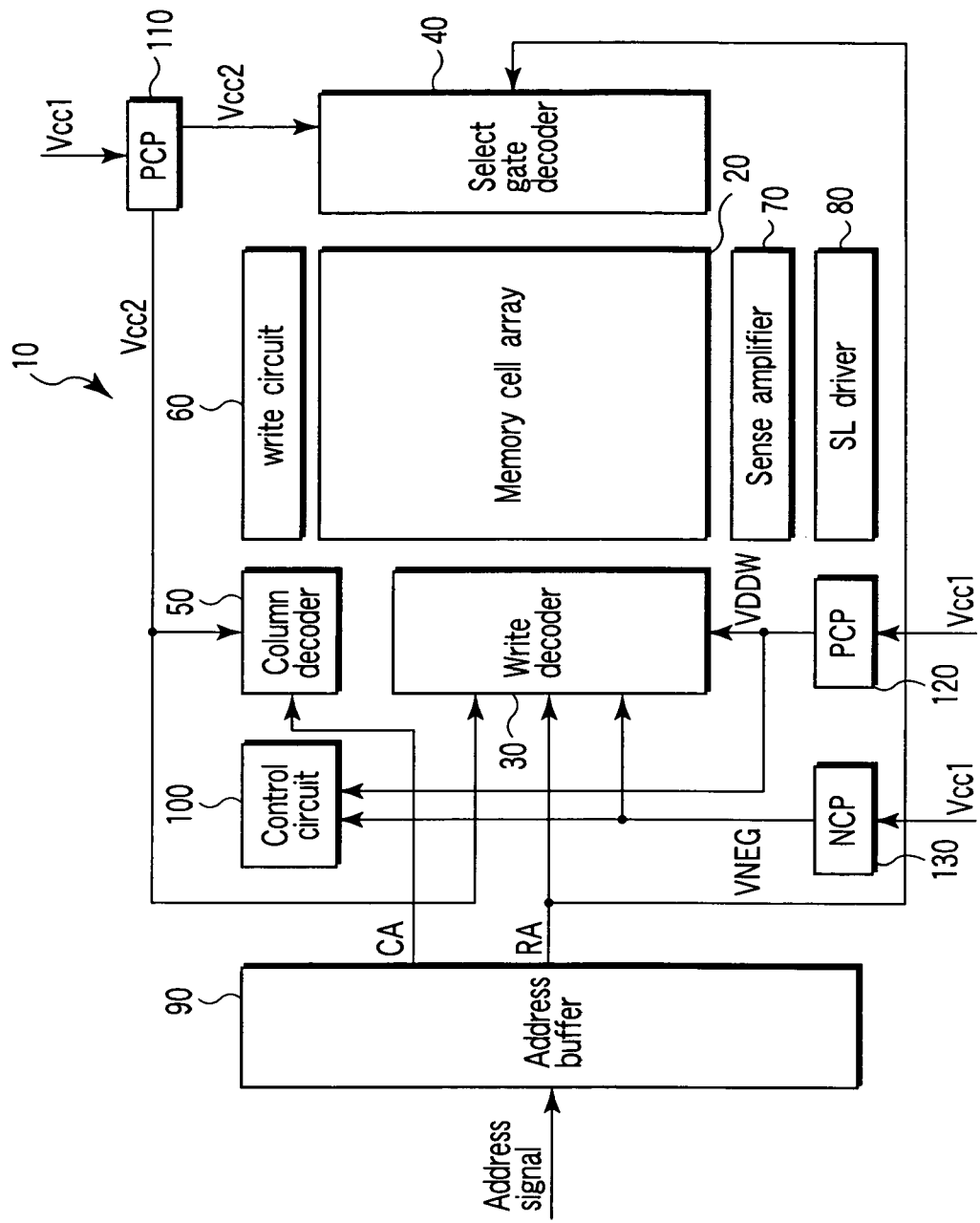
F I G. 1

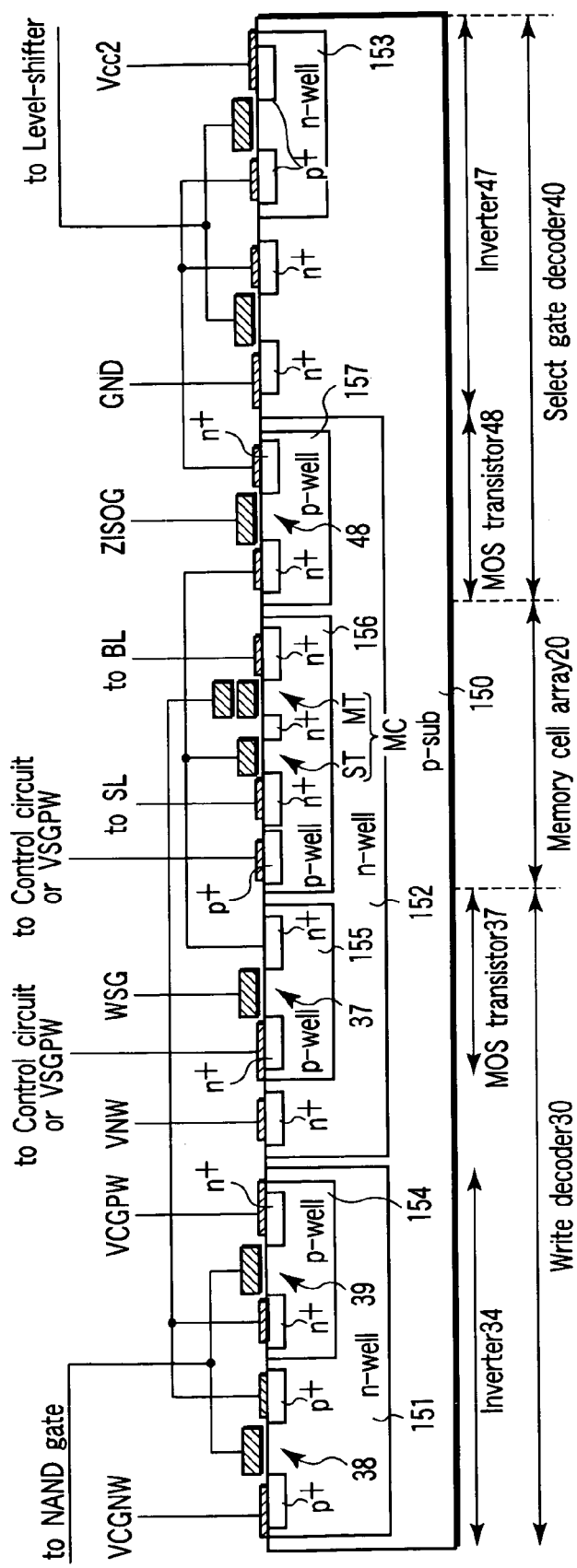
F I G. 5

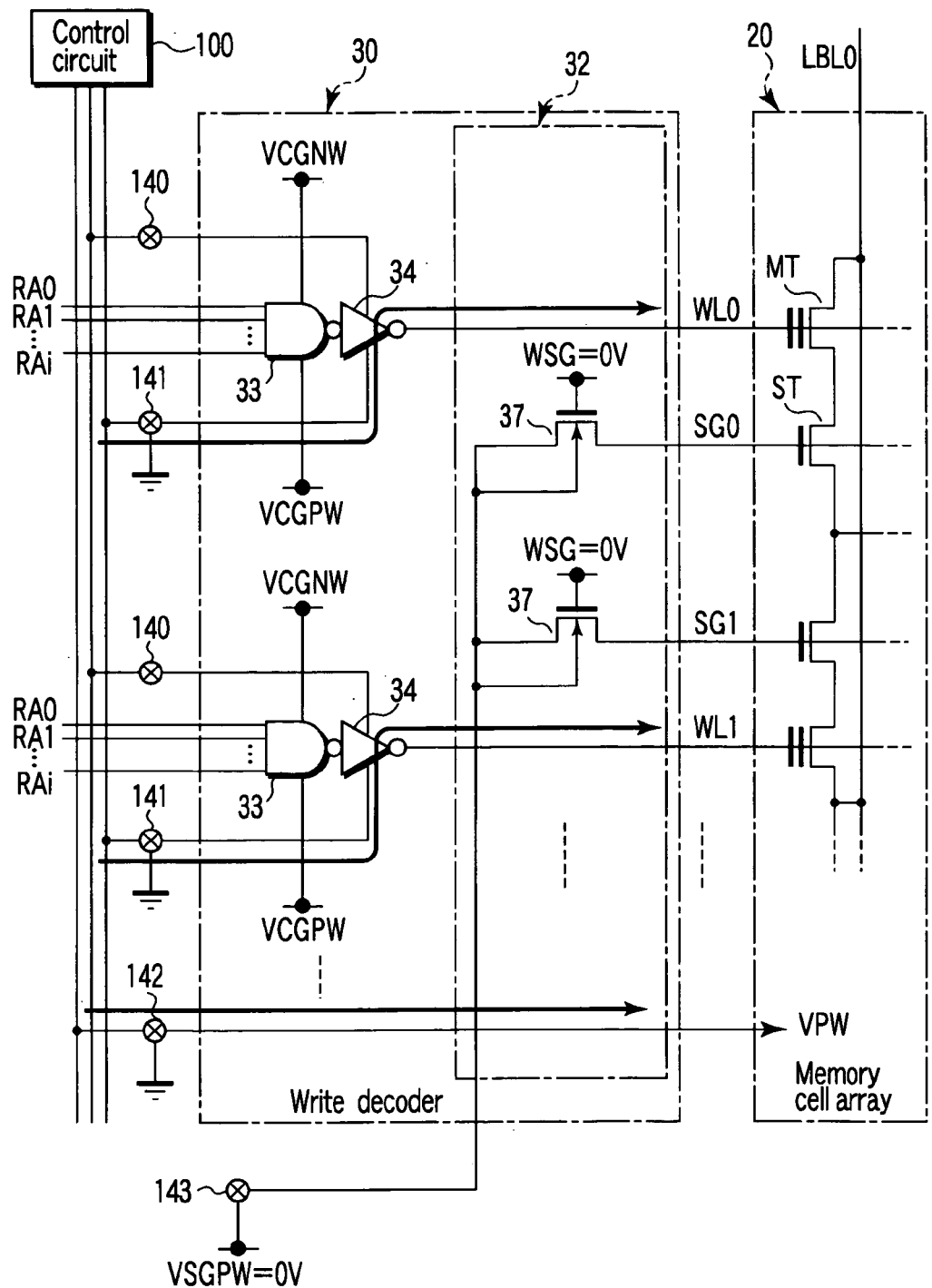
F I G. 13

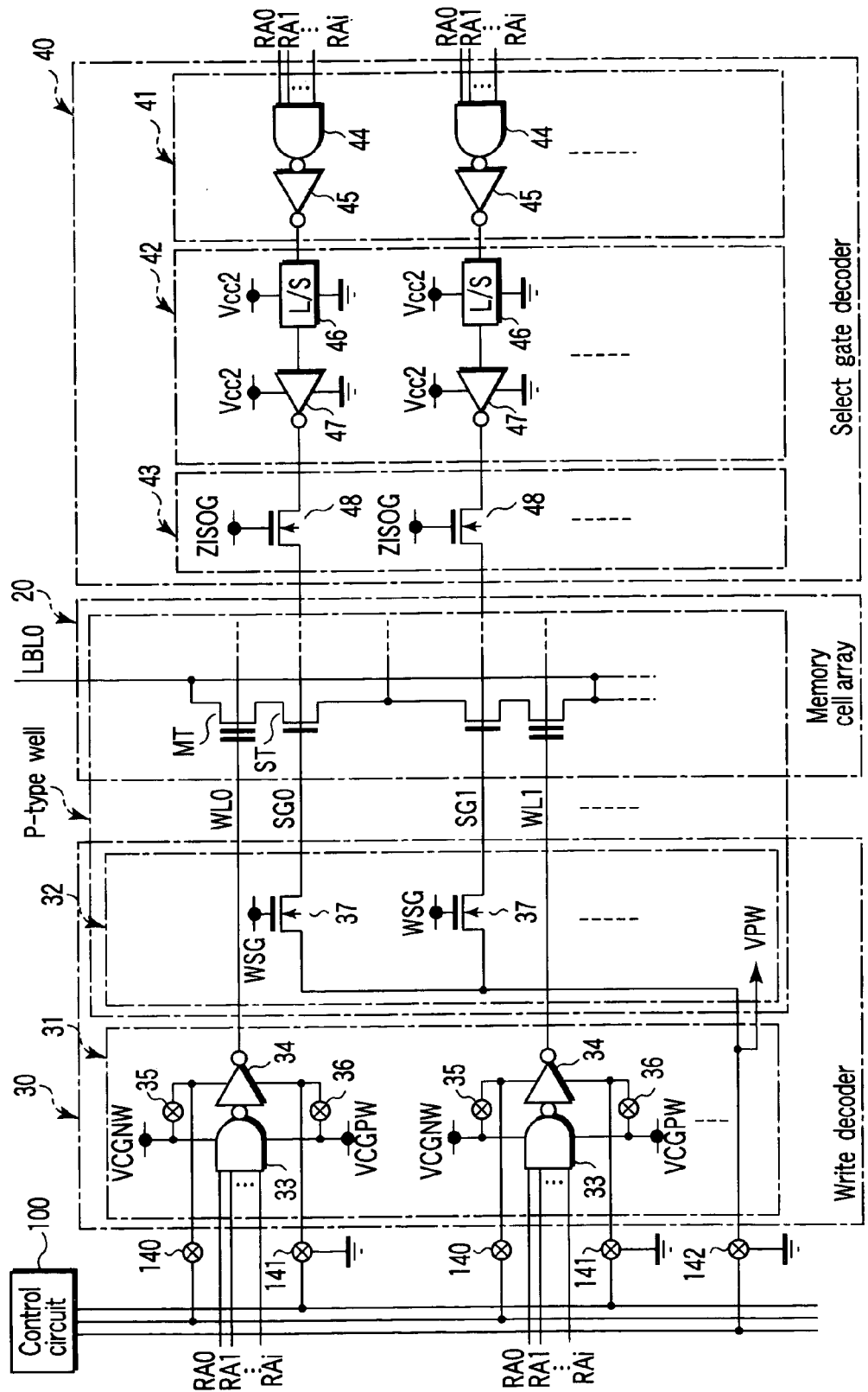
F I G. 14

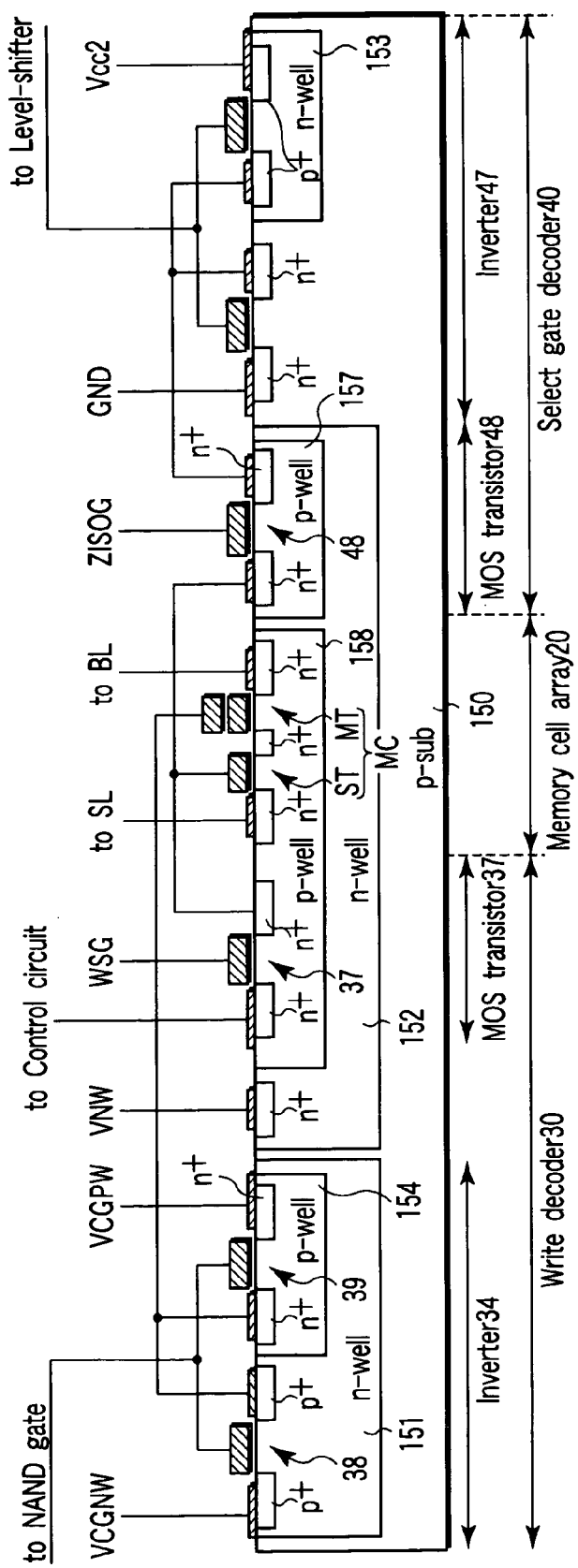
F I G. 15

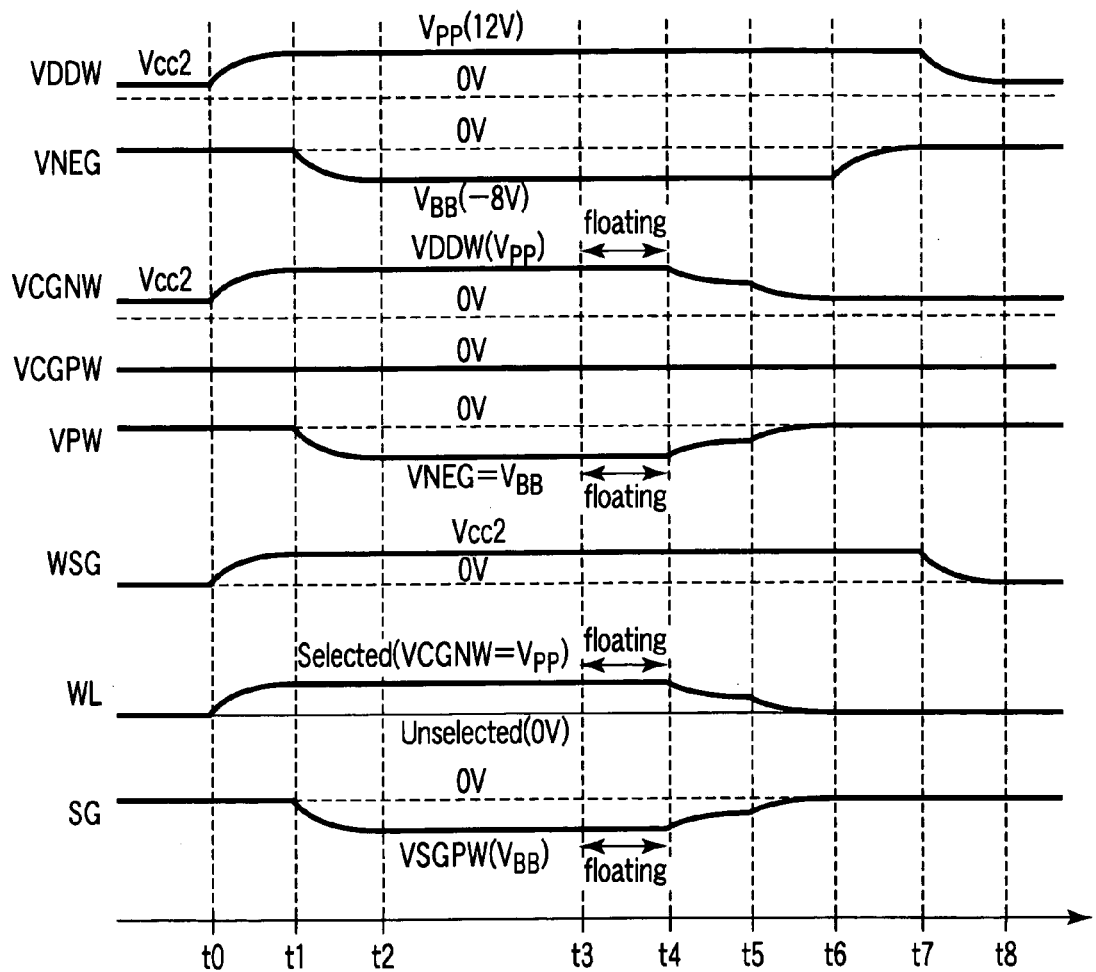
F I G. 16

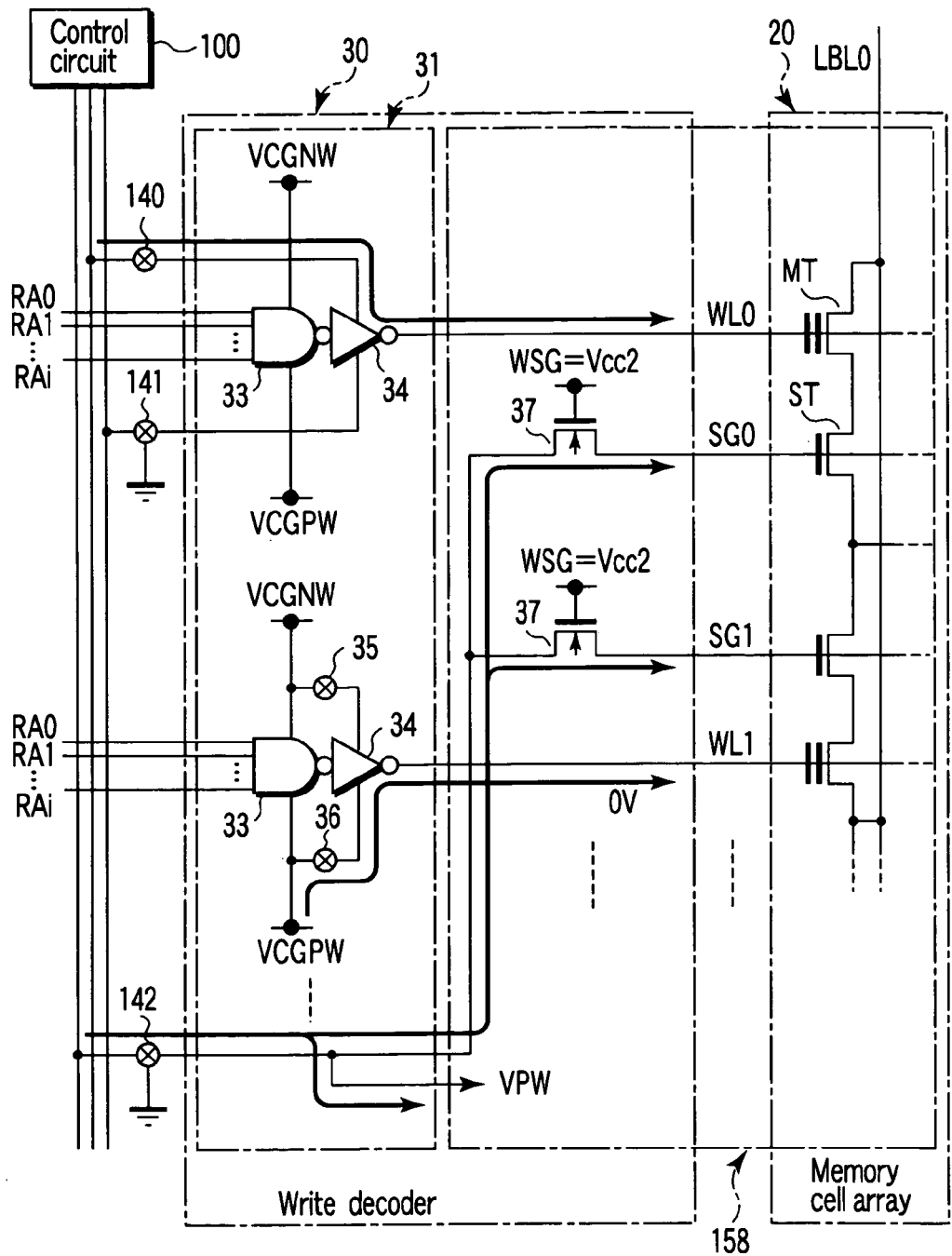
F I G. 19

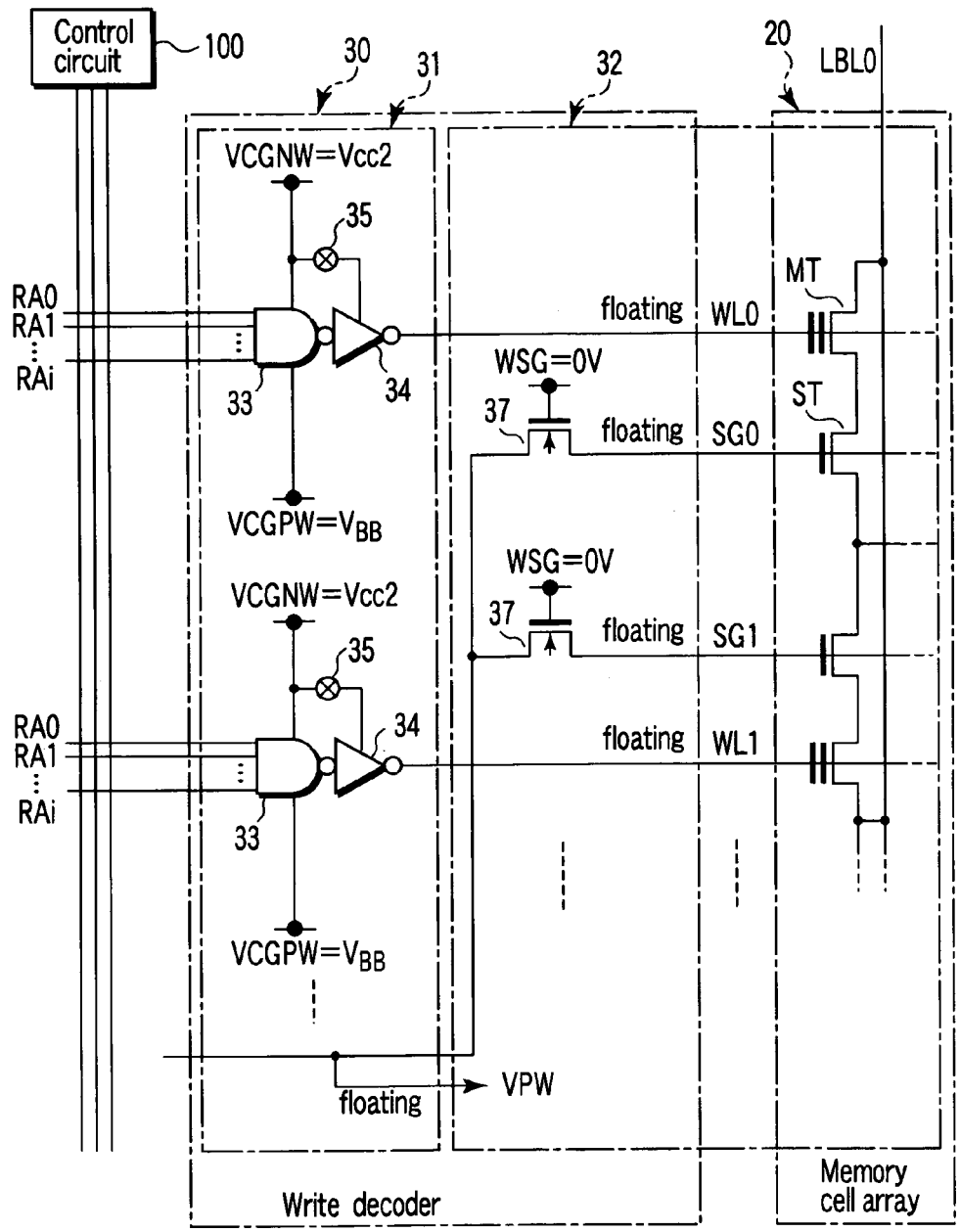
F I G. 21

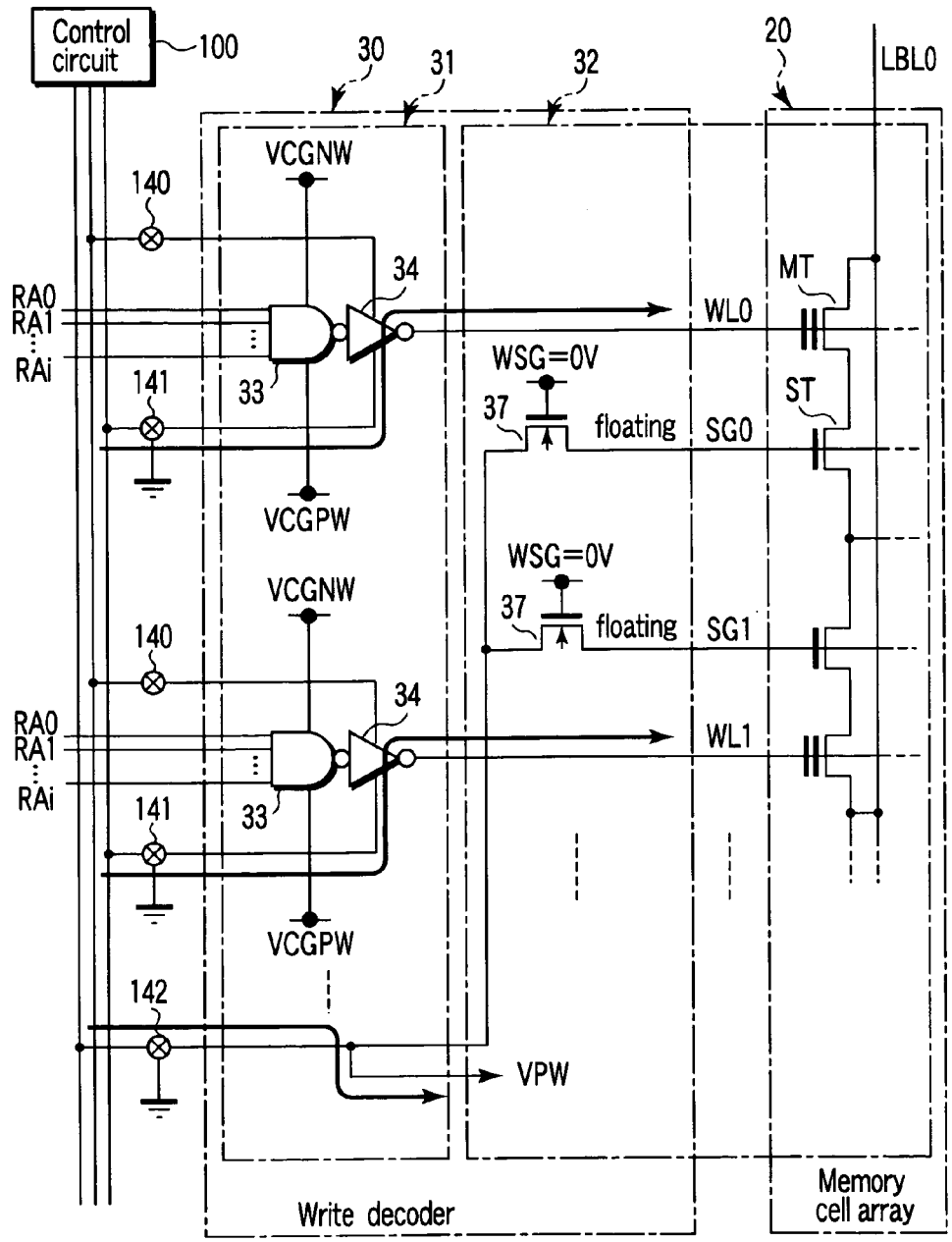
F I G. 22

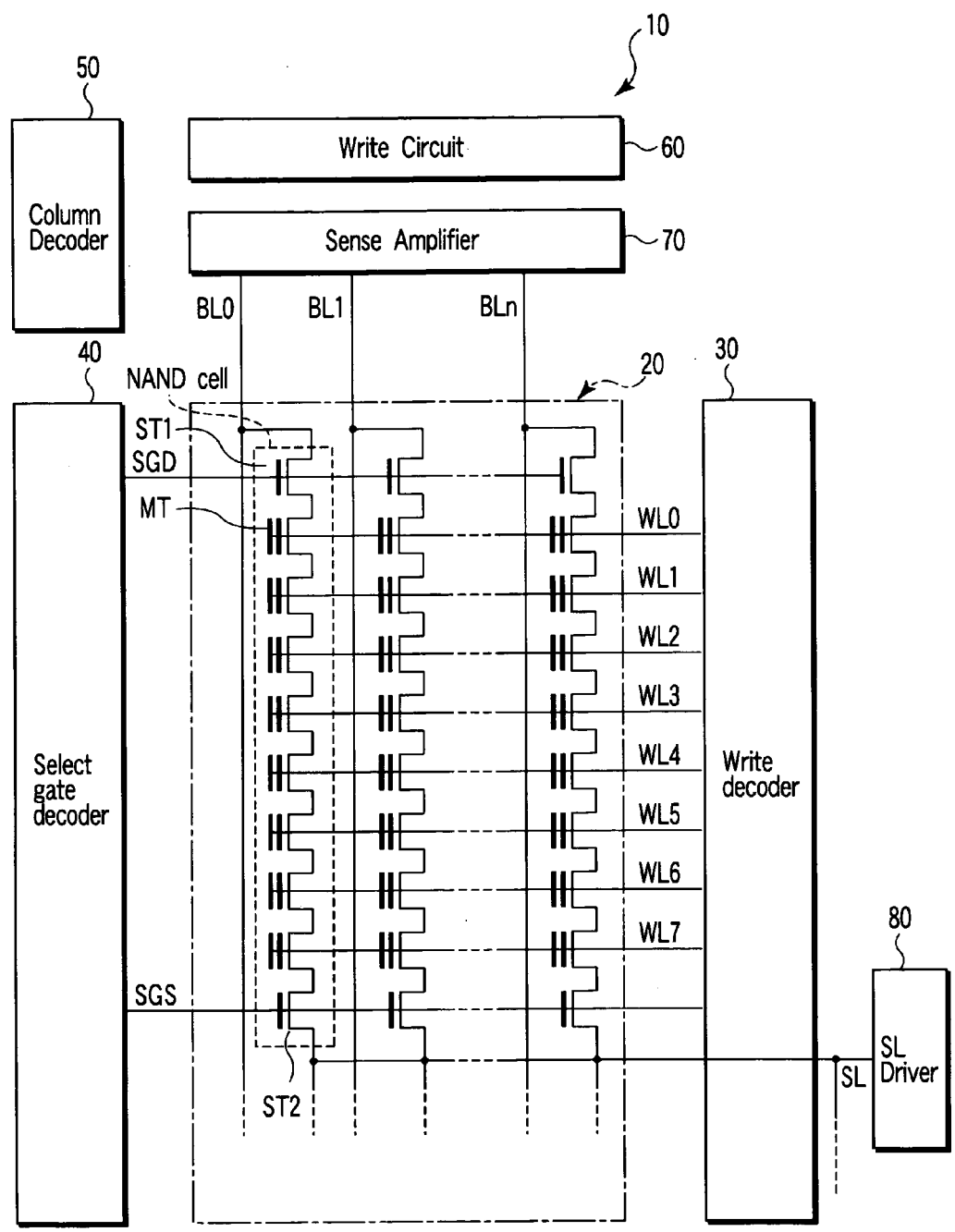
F I G. 25

NONVOLATILE SEMICONDUCTOR MEMORY DEVICE WITH MOS TRANSISTORS EACH HAVING A FLOATING GATE AND A CONTROL GATE

CROSS-REFERENCE TO RELATED APPLICATIONS

This application is based upon and claims the benefit of priority from the prior Japanese Patent Application No. 2003-209312, filed Aug. 28, 2003, the entire contents of which are incorporated herein by reference.

BACKGROUND OF THE INVENTION

1. Field of the Invention

This invention relates to a nonvolatile semiconductor memory device. More particularly, this is invention relates to a nonvolatile semiconductor memory device with MOS transistors each having a floating gate and a control gate.

2. Description of the Related Art

Nonvolatile semiconductor memories including NOR flash memories and NAND flash memories are widely used.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell.

Jpn. Pat. Appln. KOKAI Publication No. 2000-90680 and U.S. Pat. No. 6,222,774 have disclosed the following technique, used in the NOR flash memory. Specifically, they have disclosed the technique for preventing an adverse effect caused by the coupling between the word lines and the semiconductor substrate when the potentials of the word lines and semiconductor substrate are returned to 0 V after writing is done.

Unlike the NOR flash memory, the conventional flash memory with memory cells, each having two MOS transistors, has select gate lines. Therefore, not only the coupling between the word lines and the semiconductor substrate but also the coupling between the select gate lines and the semiconductor substrate exert an adverse effect on the operation. Particularly, taking into account the withstand voltage of the gate insulating film of the selected transistor, the methods disclosed in Jpn. Pat. Appln. KOKAI Publication No. 2000-90680 and U.S. Pat. No. 6,222,774 are insufficient from the viewpoint of operation reliability.

BRIEF SUMMARY OF THE INVENTION

A semiconductor memory device according to an aspect of the present invention comprises:

memory cells each of which includes a first MOS transistor with a stacked gate including a floating gate formed on a first well region formed at the surface of a semiconductor substrate with a gate insulating film interposed therebetween and a control gate formed on the floating gate with an inter-gate insulating film interposed therebetween, and a second MOS transistor having a drain connected to a source of the first MOS transistor;

a memory cell array which has the memory cells arranged in a matrix;

word lines each of which connects in common control gates of the first MOS transistors in a same row;

select gate lines each of which connects in common gates of the second MOS transistors in a same row;

a first row decoder which, in a write operation, selects any one of the word lines, applies a positive potential to the selected word line and applies a negative potential to the first well region, and after the write operation, brings the selected word line and the first well region into a floating state;

a second row decoder which selects any one of the select gate lines in a read operation; and a control circuit which short-circuits the selected word line and first well region in the floating state, the select gate lines being connected to a negative potential node in a write operation, and after the write operation, the select gate lines being isolated from the negative potential node and connected to the first well region.

BRIEF DESCRIPTION OF THE SEVERAL VIEWS OF THE DRAWING

FIG. 1 is a block diagram of a flash memory according to a first embodiment of the present invention;

FIG. 5 is a sectional view of a part of the memory cell array, select gate decoder, and write decoder provided in the flash memory of the first embodiment;

FIGS. 11 to 13 are circuit diagrams of the write decoder and memory cell array in an erase operation of the flash memory of the first embodiment;

FIG. 14 is a circuit diagram of a part of the memory cell array, select gate decoder, and write decoder provided in a flash memory according to a second embodiment of the present invention;

FIG. 15 is a sectional view of a part of the memory cell array, select gate decoder, and write decoder provided in the flash memory of the second embodiment;

FIG. 16 is a timing chart of various signals in a write operation of the flash memory of the second embodiment;

FIGS. 17 to 19 are circuit diagrams of the write decoder and memory cell array in a write operation of the flash memory of the second embodiment;

FIGS. 20 to 22 are circuit diagrams of the write decoder and memory cell array in an erase operation of the flash memory of the second embodiment;

FIG. 25 is a block diagram of a flash memory according to a first modification of each of the first to third embodiments;

DETAILED DESCRIPTION OF THE INVENTION

Figure 2:
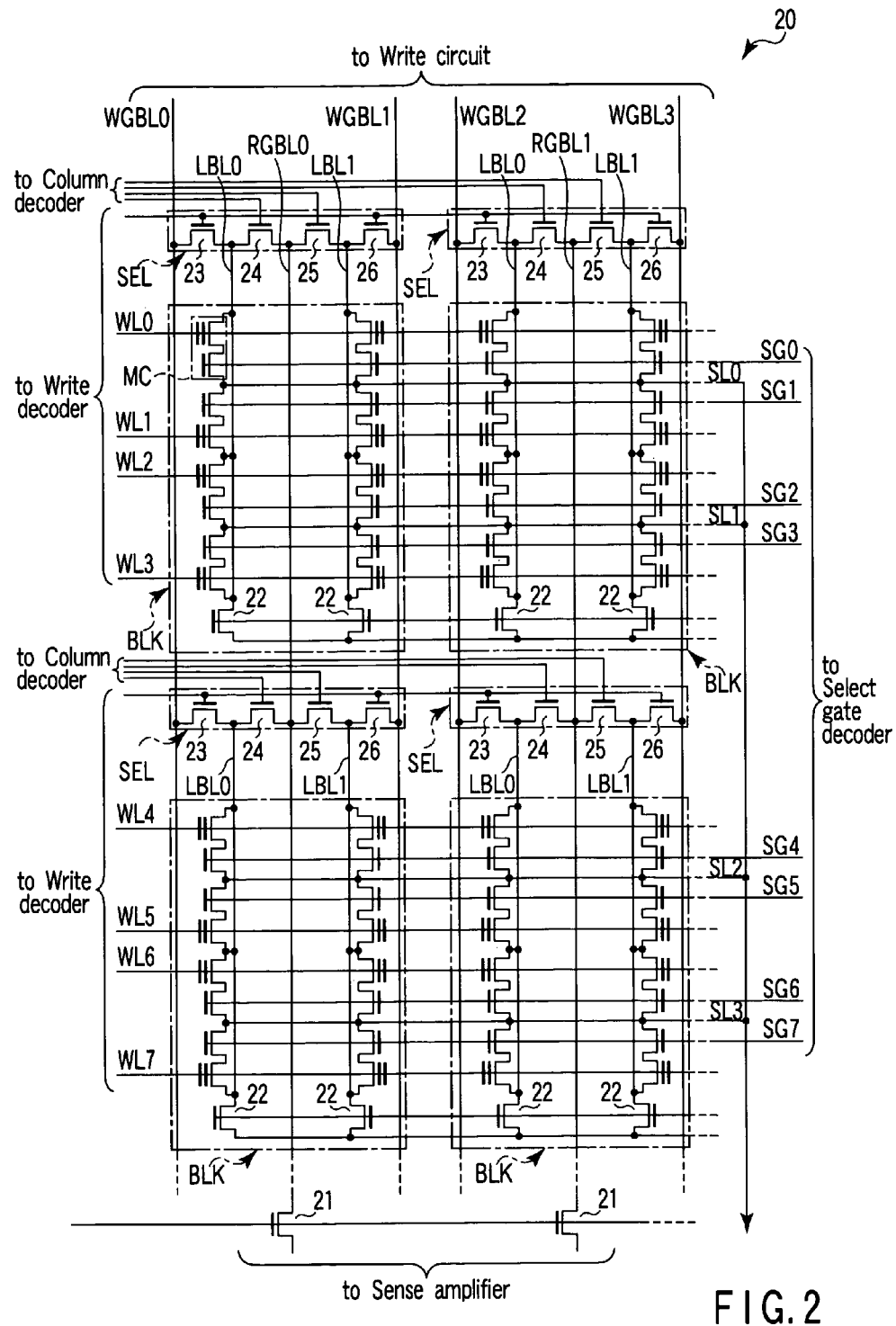
FIG. 2 is a circuit diagram of a memory cell array provided in the flash memory of the first embodiment.

A nonvolatile semiconductor memory device according to a first embodiment of the present invention will be explained by reference to FIG. 1. FIG. 1 is a block diagram of a flash memory according to the first embodiment.

As shown in FIG. 1, a flash memory 10 comprises a memory cell array 20, a write decoder 30, a select gate decoder 40, a column decoder 50, a write circuit 60, a sense amplifier 70, a source line driver 80, an address buffer 90, a control circuit 100, and boosting circuits 110 to 130.

The memory cell array 20 has a plurality of memory cells arranged in a matrix. The configuration of the memory cell array 20 will be explained by reference to FIG. 2. FIG. 2 is a circuit diagram of a part of the memory cell array 20.

As shown in FIG. 2, the memory cell array 20 includes ((m+1)×(n+1)) memory cell blocks BLKs (m and n are natural numbers), selectors SELs provided for the memory cell blocks BLKs in a one-to-one correspondence, and MOS transistors 21. Although only (2×2) memory cell blocks BLKs are shown in FIG. 2, the number of memory cell blocks is not limited to (2×2).

Each of the memory cell blocks includes a plurality of memory cells MCs. Each of the memory cells MCs has a memory cell transistor MT and a select transistor ST, which have their current paths connected in series with each other. The memory cell transistor MT has a stacked gate structure that includes a floating gate formed on a semiconductor substrate with a gate insulating film interposed therebetween and a control gate formed on the floating gate with an inter-gate insulating film interposed therebetween. The floating gates are isolated from one memory cell transistor MT to another. The select transistor ST has a stacked gate structure as does the memory cell transistor MT. However, the select transistors ST differ from the memory cell transistors MT in that the floating gates adjacent to each other in the row direction are connected to each other and that their floating gate and control gate are connected to each other electrically. Therefore, hereinafter, the stacked gate of the select transistor ST is referred to as just the gate. The source region of the memory cell transistor MT is connected to the drain region of the select transistor ST. Each of the memory cell blocks includes (4×2) memory cells MCs of the above configuration. The number of memory cells MCs arranged in the column direction is four in FIG. 1, which is illustrative and not restrictive. For instance, the number of memory cells MCs may be 8 or 16. The memory cells MCs adjacent to one another in the column direction share the source region of the corresponding select transistor ST or the drain region of the corresponding memory cell transistor MT. The drain regions of the memory cell transistors MTs of two columns of memory cells are connected to two local bit lines LBL0, LBL1, respectively. One end of each of the local bit lines LBL0, LBL1 is connected to the corresponding selector SEL and the other end is connected to the write decoder 30 via the current path of the MOS transistor 22. Furthermore, in the memory cell array 20, the control gates of the memory cell transistors MTs in a same row are connected in common to any one of the word lines WL0 to WL(4m-1). The gates of the select transistors STs in a same row are connected in common to any one of the select gate lines SG0 to SG(4m-1). The local bit lines LBL0, LBL1 connect the memory cell transistors in common in each of the memory cell blocks BLKs, whereas the word lines WLs and the select gate lines SGs connect in common the memory cell transistors and select transistors not only in a same row but also through the memory cell blocks. Then, the word lines WL0 to WL(4m-1) are connected to the write decoder 30. The select gate lines SG0 to SG(4m-1) are connected to the select gate decoder 40. Each of the source regions of the select transistors STs is connected in common to a plurality of memory cell blocks BLKs and then is connected to the source line driver 80.

Next, the configuration of the selector SEL will be explained. Each of the selectors SEL includes four MOS transistors 23 to 26 connected in series. Specifically, one end of the current path of the MOS transistor 23 is connected to one end of the current path of the MOS transistor 24. The other end of the current path of the MOS transistor 24 is connected to one end of the current path of the MOS transistor 25. The other end of the current path of the MOS transistor 25 is connected to one end of the current path of the MOS transistor 26. The gates of the MOS transistors 23, 26 are connected to the write decoder 30. The gates of the MOS transistors 24, 25 are connected to the column decoder 50. The connection node of the MOS transistor 23 and MOS transistor 24 is connected to the local bit line LBL0 of the corresponding memory cell block BLK. The connection node of the MOS transistor 25 and MOS transistor 26 is connected to the local bit line LBL1 of the corresponding memory cell block BLK. Furthermore, the other end of each the MOS transistors 23, 36 of the selector SEL is connected to any one of the write global bit lines WGBL0 to WGBL (2n-1). Each of the write global bit lines WGBL0 to WGBL(2n-1) connects in common the other ends of the MOS transistors 23 or MOS transistors 26 of the selectors SELs in a same column. Then, one end of each of the write global bit lines WGBL0 to WGBL(2n-1) is connected to the write circuit 60. The write circuits 60 are provided for each write global bit line. The connection node of the MOS transistor 24 and MOS transistor 25 is connected to the read global bit lines RGBL0 to RGBL(n-1). Each of the read global bit lines RGBL0 to RGBL(n-1) connects in common the connection nodes of the MOS transistors 24 and MOS transistors 25 of the selectors SELs in a same column. Then, one end of each of the read global bit lines RGBL0 to RGBL(n-1) is connected to the sense amplifier 70 via the current path of the corresponding MOS transistor 21. The gates of the respective MOS transistors 21 are connected in common and then connected to the column decoder 50.

The configuration of the memory cell array 20 may be explained in a different way as follows. In the memory cell array 20, a plurality of memory cells MCs are arranged in a matrix. The control gates of the memory cell transistors MTs of the memory cells in a same row are connected in common to any one of the word lines WL0 to WL(4m-1). The gates of the select transistors of the memory cells in a same row are connected in common to any one of the select gate lines SG0 to SG(4m-1). The drains of the memory cell transistors MTs of four memory cells MCs connected in series in a same column are connected in common to one of the local bit lines LBL0, LBL1. Specifically, a plurality of memory cells MCs in the memory cell array 20 are connected to a different local bit line in units of four memory cells MCs arranged in a column. Then, one end of each of the local bit lines in a single row is connected in common via the MOS transistor 22 and then is connected to the write decoder 30. The other ends of the local bit lines LBL0, LBL1 in a same column are connected to any one of the write global bit lines WGBL0 to WGBL(2n−1) via the MOS transistors 23, 26, and further connected to any one of the read global bit lines RGBL0 to RGBL(n−1) via the MOS transistors 24, 25. Then, the sources of the select transistors STs of the memory cells MC are connected in common and then connected to the source line driver 80. In the memory cell array configured as described above, two columns of four memory cells MCs connected to a same local bit line form one memory cell block BLK. The memory cell blocks in a same column are connected in common to a common write global bit line and a common read global bit line. On the other hand, the memory cell blocks in a different column are connected to a different write global bit line and a different read global bit line.

To return to FIG. 1, the write decoder 30 selects any one of the word lines WL0 to WL(4m−1) in a write operation and supplies a voltage to the selected word line. The write decoder 30 also supplies a voltage to the gates of the MOS transistors 23, 26 in the selector SEL and further supplies a voltage to the gate of the MOS transistor 22 and the common connection node of the local bit lines.

The select gate decoder 40 selects any one of the select gate lines SG0 to SG(4m−1) and supplies a voltage to the selected gate line.

The details of the write decoder 30 and select gate decoder 40 will be explained later.

The column decoder 50 selects one of the MOS transistors 24, 25 in the selector SEL in a read operation and supplies a voltage to the gate of the selected MOS transistor. It also supplies a voltage to the gate of the MOS transistor 21.

The write circuit 60 latches writing data.

The sense amplifier 70 amplifies read-out data.

The source line driver 80 supplies a voltage to a source line.

The address buffer 90 holds an address signal. Then, the address buffer 90 supplies not only a column address signal CA to the column decoder 50 but also a row address signal RA to the write decoder 30 and select gate decoder 40.

The control circuit 100 supplies a voltage to the write decoder. The details of the control circuit 100 will be explained later.

The boosting circuit 110 generates a positive potential. Specifically, the boosting circuit 110 steps up an externally inputted voltage Vcc (1.25 to 1.65 V) to an internal voltage Vcc2 (2.5 to 3.6 V). Then, the boosting circuit 110 supplies the internal voltage Vcc2 to the write decoder 30, select gate decoder 40, and column decoder 50.

The boosting circuit 120 generates a positive potential. Specifically, the boosting circuit 120 generates an internal voltage VDDW on the basis of the voltage Vcc1 externally supplied. The internal voltage VDDW is, for example, 0 V to Vpp (12V).

The boosting circuit 130 generates a negative potential. Specifically, the boosting circuit 130 generates an internal voltage VNEG on the basis of the voltage Vcc1 externally supplied. The internal voltage VNEG is, for example, 0 V to VBB (−8V).

Figure 3:
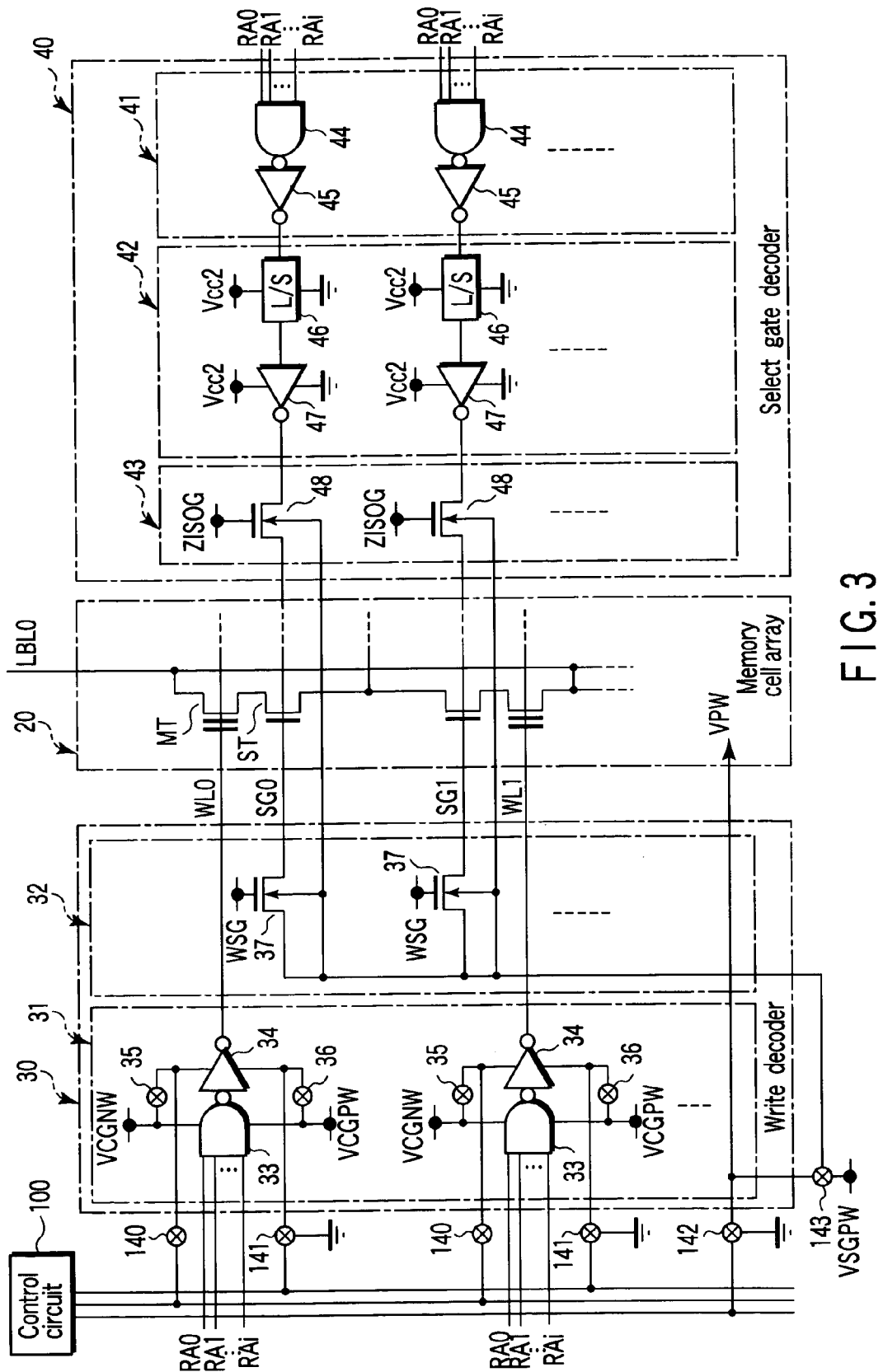
FIG. 3 is a circuit diagram of a part of the memory cell array, select gate decoder, and write decoder provided in the flash memory of the first embodiment.

Next, the details of the write decoder 30, select gate decoder 40, and control circuit 100 will be explained by reference to FIG. 3. FIG. 3 is a circuit diagram of a part of the flash memory 10. FIG. 3 particularly shows the details of the write decoder 30 and select gate decoder 40.

First, the configuration of the select gate decoder 40 will be explained. The select gate decoder 40 includes a row address decode circuit 41, a voltage converting circuit 42, and a switch element group 43. The row address decode circuit 41, which operates on a power supply voltage Vcc1 (=1.25 to 1.65 V), decodes (i+1)-bit row address signals RA0 to RAi, thereby producing a row address decode signal. The row address decode circuit 41 has a NAND circuit 44 and an inverter 45 which are provided for each of the select gate lines SG0 to SG(4m−1). The NAND circuit 44 performs NAND operation on each bit in the row address signals RA0 to RAi. Then, the inverter 45 inverts the result of the NAND operation and outputs the inverted result as a row address decode signal.

The voltage converting circuit 42, which operates on a power supply voltage Vcc2 (=2.5 to 3.6 V), converts a row address decode signal of a Vcc1 level into that of a Vcc2 level. The power supply voltage Vcc2 is supplied from the boosting circuit 110. The voltage converting circuit 42 has a level shift circuit 46 and an inverter 47 which are provided for each of the select gate lines SG0 to SG(4m−1). The level shift circuit 46 converts the voltage level of the row address decode signal into the Vcc2 level. The inverter 47 inverts the output of the level shift circuit 46.

The switch element group 43 has n-channel MOS transistors 48. The n-channel MOS transistors 48 are provided for each of the select gate lines SG0 to SG(4m−1). Then, the output of the inverter 47 is supplied to the corresponding one of the select gate lines SG0 to SG(4m−1) via the current path of the corresponding n-channel MOS transistor 48. A control signal ZISOG is inputted to the gate of each n-channel MOS transistor 48.

Next, the configuration of the write decoder 30 will be explained. The write decoder 30 includes a row address decode circuit 31 and a switch element group 32. The row address decode circuit 31 decodes (i+1)-bit row address signals RA0 to RAi, thereby producing a row address decode signal. The row address decode signal is supplied to the word lines WL0 to WL(4m−1). The row address decode circuit 31 has a NAND circuit 33 and an inverter 34 which are provided for each of the word lines WL0 to WL(4m−1). The NAND circuit 33 has its positive power supply voltage node connected to a power supply voltage node VCGNW and its negative power supply voltage node connected to a power supply voltage node VCGPW. Then, the NAND circuit 33 performs NAND operation on each bit in the row address signals RA0 to RAi. Either the voltage VDDW generated by the boosting circuit 120 and the voltage VNEG generated by the boosting circuit 130 or the Vcc2 generated by the boosting circuit 110 is supplied to the power supply voltage nodes VCGNW, VCGPW. Then, the inverter 34 inverts the result of the NAND operation and outputs the inverted result as a row address decode signal. The positive power supply voltage node of the inverter 34 is connected to not only the power supply voltage node VCGNW via the switch element 35 but also the control circuit 100 via the switch element 140. The negative power supply voltage node of the inverter 34 is connected to not only the power supply voltage node VCGPW via the switch element 36 but also the control circuit 100 via the switch element 141. Therefore, the inverter 34 operates on the basis of the voltage at the power supply voltage nodes VCGNW, VCGPW or the voltage supplied from the control circuit 100.

The switch element group 32 has n-channel MOS transistors 37. The n-channel MOS transistors 37 are provided for each of the select gate lines SG0 to SG(4m−1). Then, one end of the current path of the n-channel MOS transistor 37 is connected to the corresponding one of the select gate lines SG0 to SG(4m−1). The other end of the current path is connected to the power supply voltage node VSGPW or the well potential VPW of the well region where the memory cell array 20 is formed, via a switch element 143. A control signal WSG is inputted to the gates of the n-channel MOS transistors 37. The back gate potential (potential of the well region) of each of the n-channel MOS transistors 37 is set to not only the same potential as that of the other end of the corresponding current path but also the same potential as the back gate potential of the corresponding n-channel MOS transistor 48.

The control circuit 100 is connected to the power supply voltage nodes (positive and negative) of each inverter 34 via the switch elements 140, 141. It is also connected to the well potential VPW of the memory cell array 20 via the switch element 142.

Figure 4:
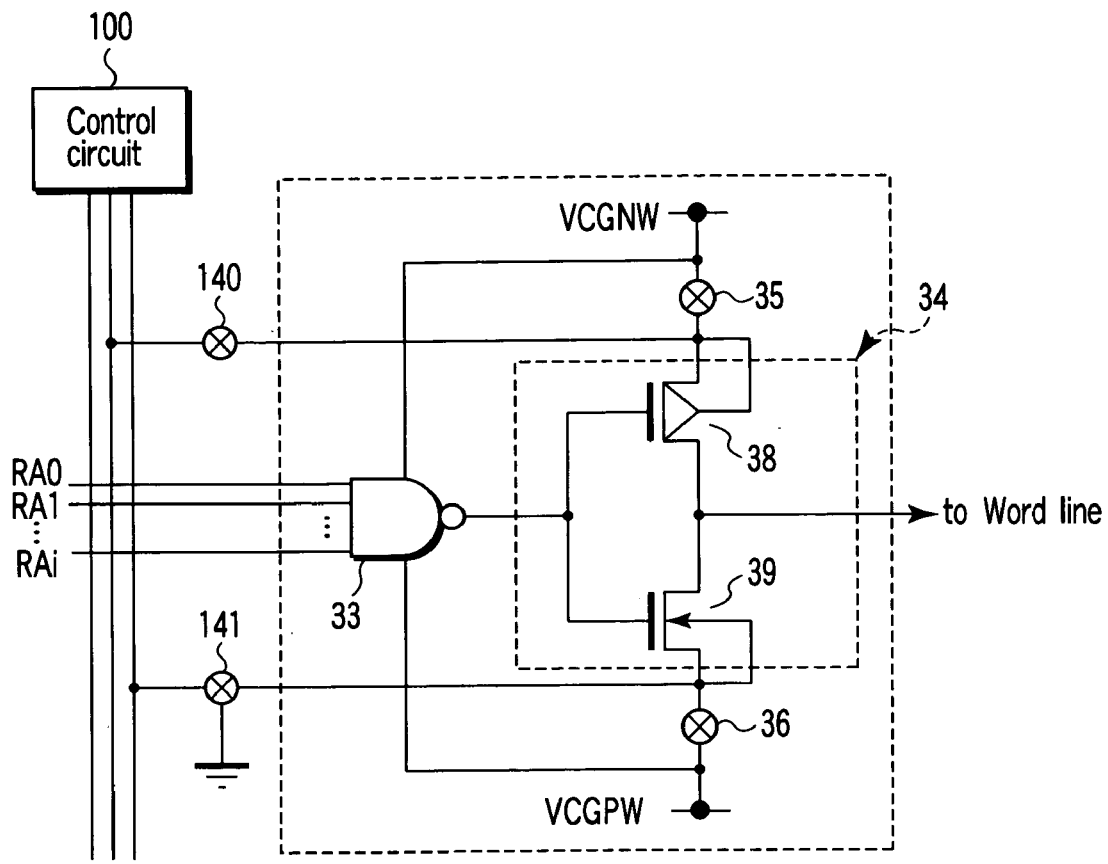
FIG. 4 is a circuit diagram of the row address decode circuit in FIG. 3.

The details of the configuration of the row address decode circuit 31 in the write decoder 30 will be explained by reference to FIG. 4. FIG. 4 is a circuit diagram of the row address decode circuit.

As shown in FIG. 4, the inverter 34 includes a p-channel MOS transistor 38 and an n-channel MOS transistor 39. The source of the p-channel MOS transistor is connected in common to the back gate and further connected to not only the VCGNW node via the switch element 35 but also the control circuit 100 via the switch element 140. The drain of the n-channel MOS transistor 39 is connected to the drain of the p-channel MOS transistor 38. The source of the n-channel MOS transistor 39 is connected in common to the back gate and further connected to not only the VCGPW node via a switch element 36 but also the control circuit 100 via a switch element 141. The gates of the p-channel MOS transistor 38 and n-channel MOS transistor 39 are connected in common to each other and then connected to the output node of the NAND gate 33. In addition, the connection node of the drain of the p-channel MOS transistor 38 and the drain of the n-channel MOS transistor 39 is connected to the corresponding word line.

FIG. 5 is a sectional view of part of the memory cell array 20, select gate decoder 40, and write decoder 30 shown in FIG. 3. FIG. 5 particularly shows only a single memory cell MC, inverters 34, 47, and MOS transistors 37, 48.

As shown in FIG. 5, n-well regions 151 to 153 are formed at the surface of a semiconductor substrate 150 in such a manner that they are isolated from one another. The n-well region 151 is for forming the inverter 34 in the write decoder 30. The n-well region 152 is for forming the p-channel MOS transistor 37 in the write decoder 340, the memory cells in the memory cell array 20, and the p-channel MOS transistors 48 in the select gate decoder 40. The n-well region 153 is for forming the inverters 47 in the select gate decoder 40.

At the surface of the n-well region 151, a p-well region 154 is further formed. Then, the p-channel MOS transistors 38, 39 included in the inverter 34 are formed on the n-well region 151 and p-well region 154. The p-well region 151 is connected to the VCGNW node and the p-well region 154 is connected to the VCGPW node.

P-well regions 155 to 157 are further formed at the surface of the n-well region 152. The MOS transistor 37 in the write decoder 30, the memory cells MCs, and the MOS transistor 48 in the select gate decoder 40 are formed on the p-well regions 155, 156, 157, respectively. While the select transistor of each memory cell ST is shown as a single-layer gate, it may have a stacked gate structure as does the memory cell transistor MT. Then, the n-well region 152 is connected to a power supply potential node VNW. The p-well regions 155, 156 are connected to the control circuit 100 or VSGPW node. As described above, the p-well region 157 is set to the same potential as that of the p-well region 155.

P-channel MOS transistors in the inverter 47 are formed on the n-well region 153. N-channel MOS transistors in the inverter 47 are formed on the p-type semiconductor substrate 150. The voltage Vcc2 is applied to the n-well region 153.

Next, the operation of the flash memory configured as described above will be explained briefly. Its detailed explanation will be given later.

<Write Operation>

Data is written simultaneously into all the memory cells connected to any one of the word lines. Either "0" data or "1" data is written, depending on whether electrons are injected into the floating gate of the memory cell transistor MT. Electrons are injected into the floating gate by Fowler-Nordheim (FN) tunneling.

First, in FIG. 1, writing data ("1" or "0") is inputted from an I/O terminal (not shown). Then, the writing data is inputted to the write circuit 60. If "1" data is stored in the write circuit 60, the output of the write circuit 60 goes to the high voltage side, or 0 V. Conversely, if "0" data is stored in the write circuit 60, the output of the write circuit 60 goes to the low voltage side, or VBB (−8 V). The voltage is supplied to the corresponding global bit line WGBL (see FIG. 2).

Then, the write decoder 30 not only selects any one of the word lines WL0 to WL(4m−1) but also turns off the MOS transistor 22. Vpp (e.g. 12 V) is supplied to the selected word line. The select gate decoder 40 brings the select gate lines SG0 to SG(4m−1) into a low level (VBB). As a result, all of the select transistors go into the off state.

Furthermore, the write decoder 30 turns on the MOS transistors 23, 26 in the selector SEL corresponding to the memory cell block BLK including the selected word line. As a result, the write global bit line WGBL and the local bit line LBL are connected to each other electrically. The MOS transistors 23, 26 in the selectors SEL corresponding to the memory cell blocks BLK not including the selected word line are turned off. On the other hand, the column decoder 50 turns off the MOS transistors 24, 25 in all the selectors SEL. As a result, the read global bit line RGBL and the local bit line LBL are isolated from each other electrically.

As a result, the write global bit line supplies a potential corresponding to "1" data or "0" data to the local bit line LBL of the memory cell block BLK including the selected word line via the MOS transistors 23, 26 in the selector SEL. The potential is supplied to the drain region of the memory cell transistor MT. Then, Vpp (12 V) is supplied to the selected word line WL, 0 V is applied to the drain region of the memory cell MC into which "1" data is to be written, and VBB (−8 V) is applied to the drain region of the memory cell MC into which "0" data is to be written. Thus, in the memory cell MC into which "1" data is to be written, no electron is injected into the floating gate, with the result that the memory cell MC holds the negative threshold value. On the other hand, in the memory cell MC into which "0" data is to be written, electrons are injected into the floating gate by FN tunneling. As a result, the threshold value of the memory cell changes to positive.

<Read Operation>

In a read operation, data can be read simultaneously from a plurality of memory cells connected to any one of the word lines. Then, the data is read from one memory cell MC per block.

First, the select gate decoder 40 selects any one of the select gate lines SG0 to SG(4m−1). A high level (Vcc2) is supplied to the selected select gate line. All of the unselected select gate lines are at a low level (0 V). Accordingly, the select transistors ST connected to the selected select gate lines go into the on state. The select transistors ST connected to the unselected select gate lines go into the off state. The write decoder 30 not only brings all of the word lines WL0 to WL(4m−1) into the low level but also turns off the MOS transistor 22. The source line driver 80 sets the potential of the source line to 0 V.

Furthermore, the column decoder 50 turns on any one of the MOS transistors 24, 25 in the selector SEL corresponding to the memory cell block including the selected select gate line. As a result, the read global bit lines RGBL0 to RGBL(n−1) and the local bit line LBL0 or LBL1 are connected to each other electrically. The MOS transistors 24, 25 in the selectors SEL corresponding to the memory cell blocks BLK not including the selected select gate lines are turned off. On the other hand, the write decoder turns off the MOS transistors 23, 26 in all of the selectors SEL. Thus, the write global bit line WGBL and the local bit line LBL are isolated from each other electrically. In addition, the column decoder 50 turns on the MOS transistor 21.

As a result, the local bit line LBL0 or LBL1 is connected to the sense amplifier 70 via the MOS transistor 24 or 25 in the selector SEL and the read global bit lines RGBL0 to RGBL(n−1).

Then, for example, about 1 V is applied to the read global bit lines RGBL0 to RGBL(n−1). Then, since the memory cell transistor MT of a memory cell MC into which "1" data has been written has a negative threshold value, it is turned on. Thus, in the memory cell MC connected to the selected select gate line, current flows from the read global bit line RGBL toward the source line SL via the local bit line LBL, memory cell transistor MT, and select transistor ST. On the other hand, since the memory cell transistor Mt of a memory cell MC into which "0" data has been written has a positive threshold value, it is in the off state. Thus, no current flows in the read global bit line RGBL.

As described above, the potential on the read global bit line RGBL varies. The variation is amplified by the sense amplifier 70, thereby carrying out the read operation.

<Erase Operation>

The data in all of the memory cells sharing a well region is erased at the same time. Therefore, in the example of FIG. 2, the contents in all the memory cells included in the memory cell array 20 are erased simultaneously.

Specifically, the write decoder 30 places the potentials of all the word lines WL0 to WL(4m−1) at VBB (−8 V). The potential of the semiconductor substrate (well region 156, see FIG. 5) is set at Vpp (20V). As a result, electrons are pulled out of the floating gates of the memory cell transistors of the memory cells MCs into the well region 156 by FN tunneling. As a result, the threshold voltages of all of the memory cells MCs become negative, thereby erasing the data.

Next, the write operation and read operation will be explained in detail, centering on the write decoder 30.

<Write Operation>

Figure 6:
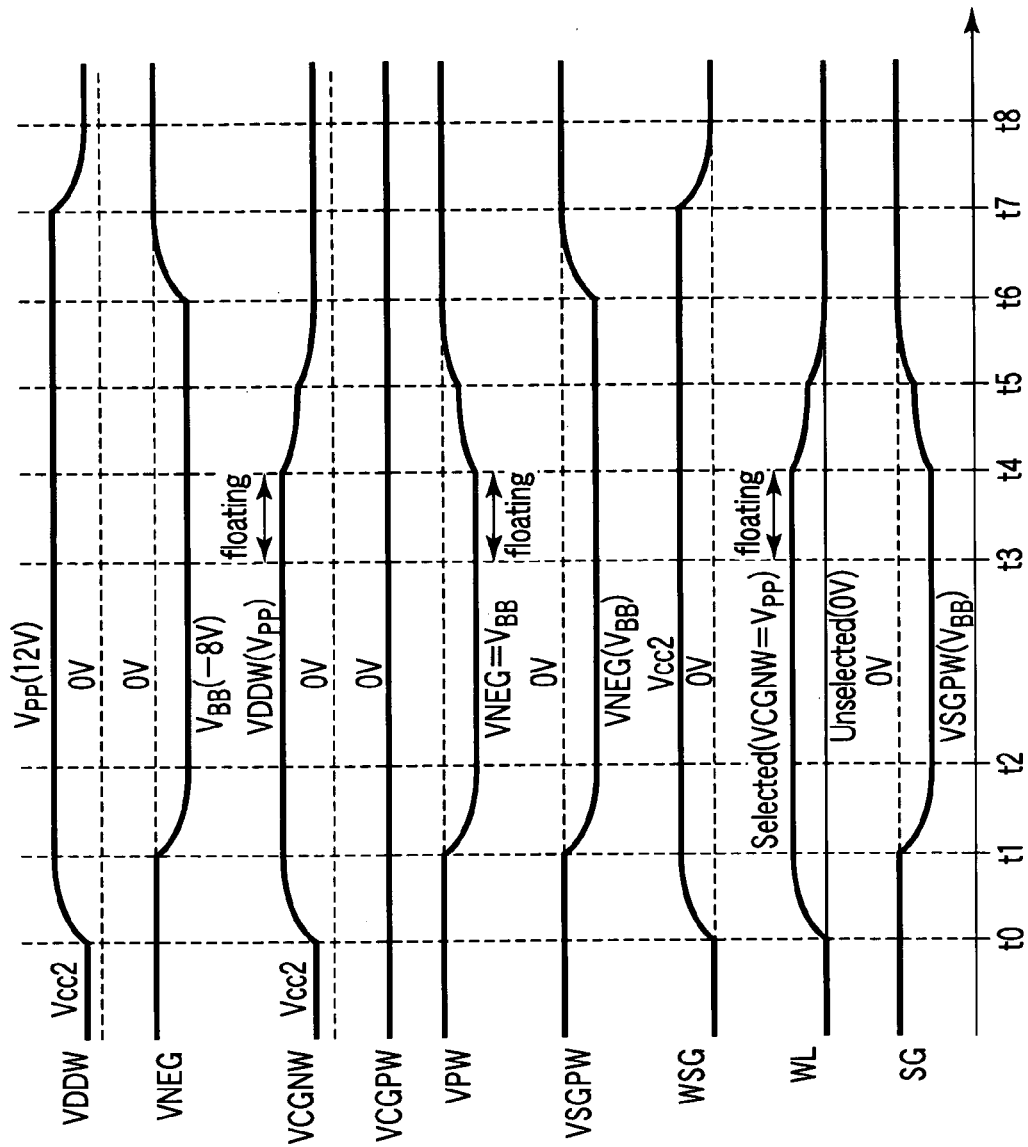
FIG. 6 is a timing chart of various signals in a write operation of the flash memory of the first embodiment.
Figure 7:
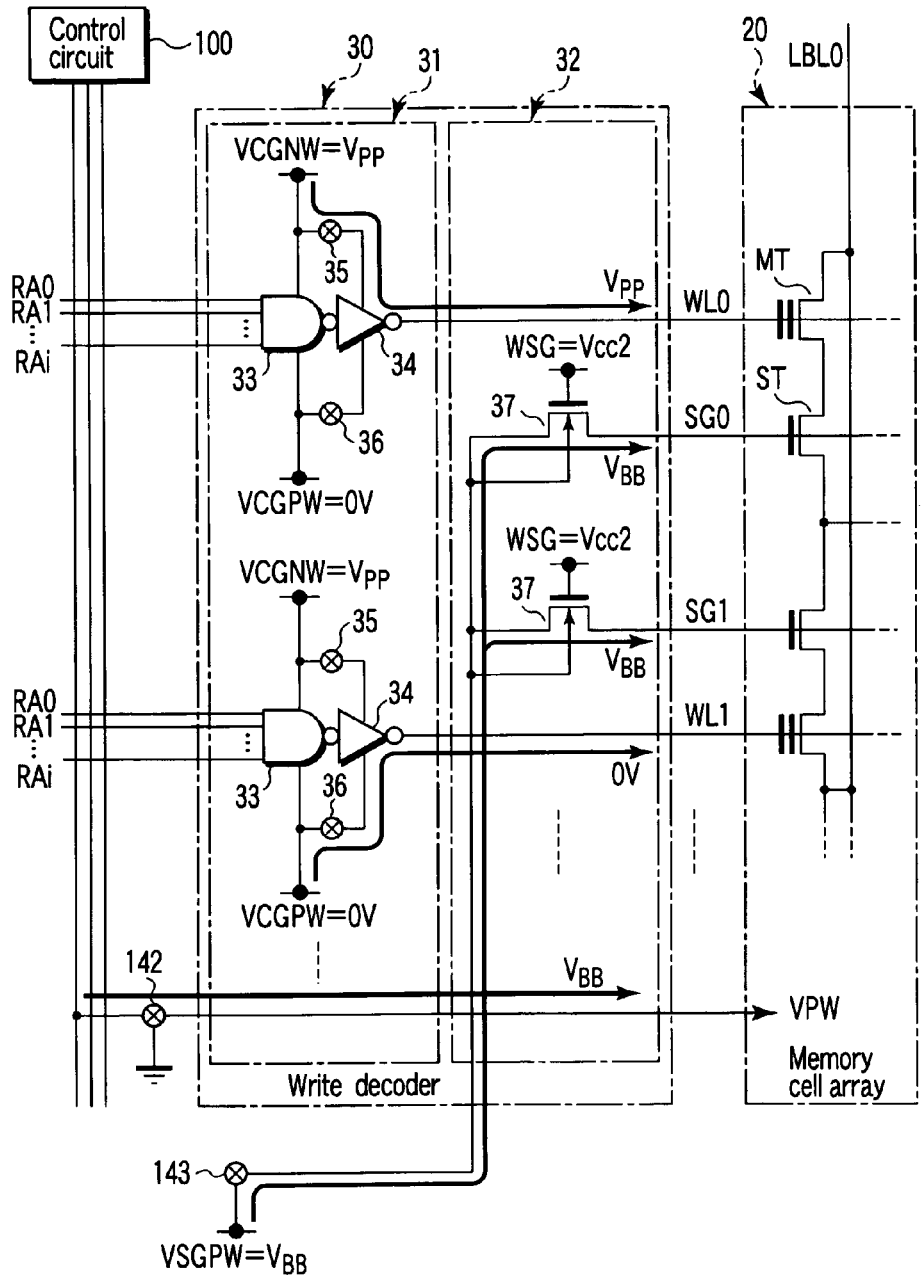
FIGS. 7 to 9 are circuit diagrams of the write decoder and memory cell array in a write operation of the flash memory of the first embodiment.
Figure 8:
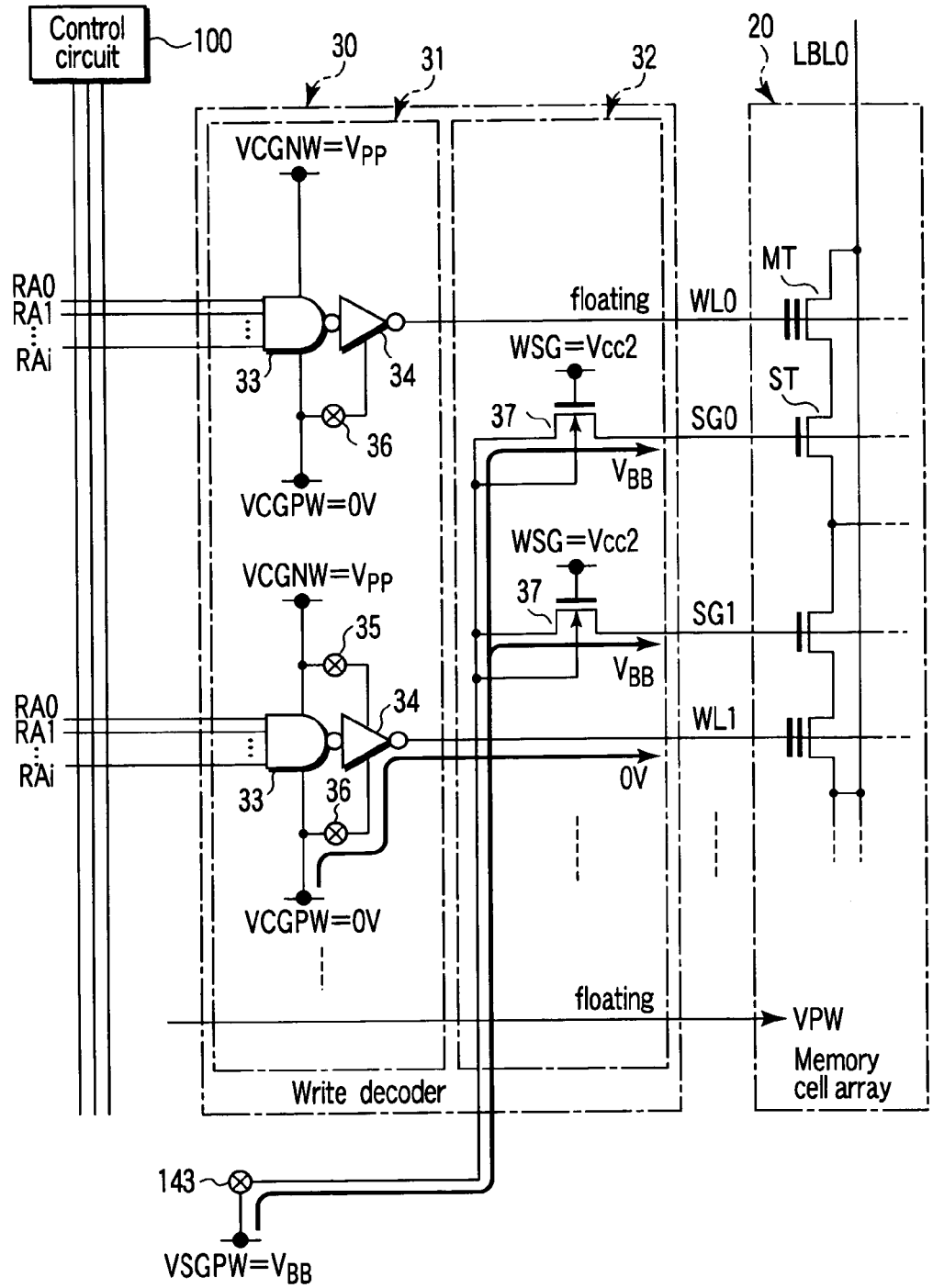
Figure 9:
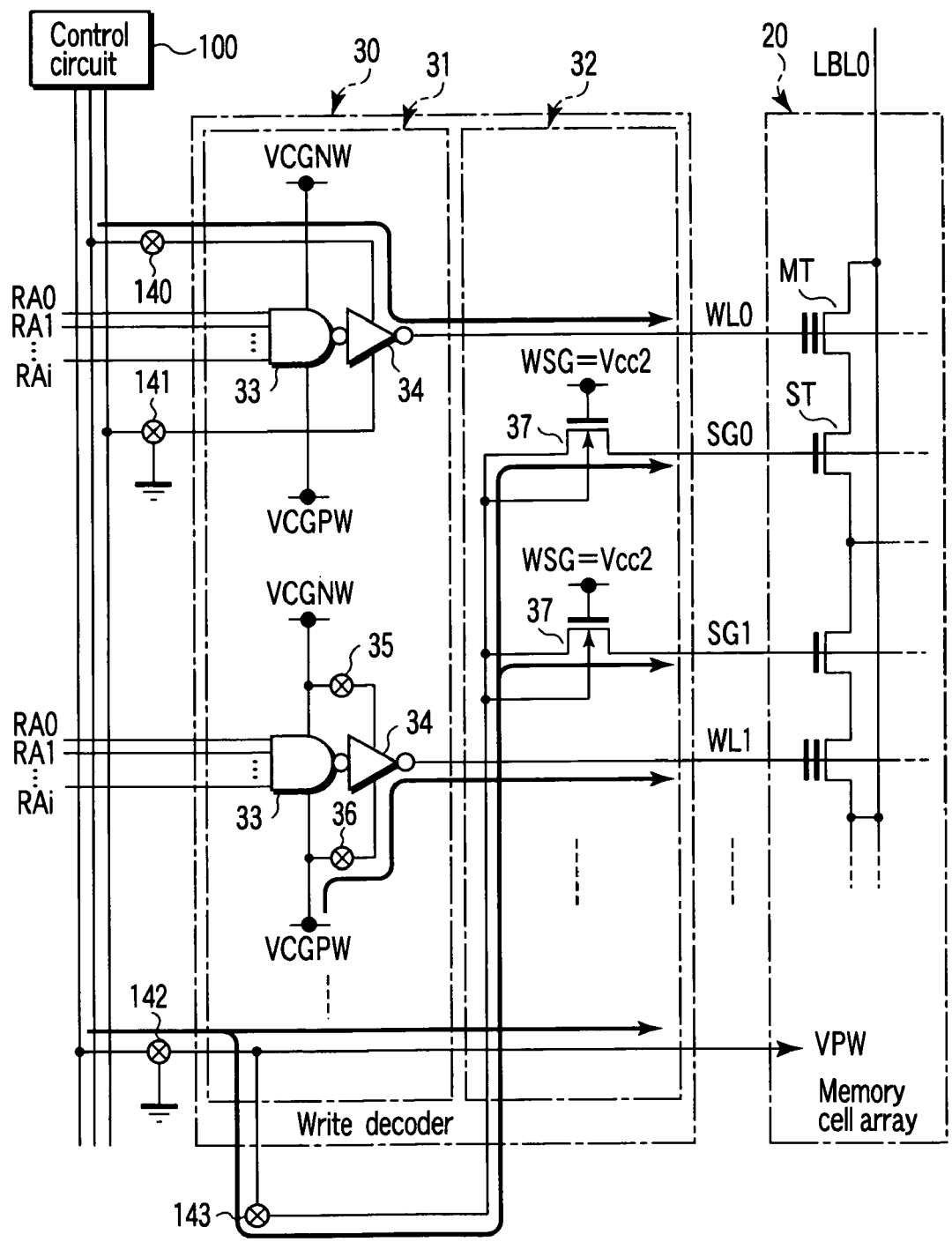

First, a write operation will be explained by reference to FIGS. 6 to 9. FIG. 6 is a timing chart of the potentials and various signals at the individual nodes. FIGS. 7 to 9 are circuit diagrams of a part of the write decoder 30 and memory cell array 20.

Suppose a write operation is started at time t1 in FIG. 6. Before time t0, the voltage VDDW generated by the boosting circuit 120 is Vcc2 and the voltage VNEG generated by the boosting circuit 130 is 0 V. At time t1 a write operation is started. FIG. 7 shows a state from time t1 to time t3. Hereinafter, explanation will be given by reference to FIG. 6 and FIG. 7. First, the boosting circuit 120 boosts the generated voltage VDDW from Vcc2 to Vpp (12V). Since VDDW is supplied to the VGCNW node of the write decoder 30, the potential at the VCGNW node also rises to Vpp. In addition, the switch elements 35, 36 in the row address decode circuit 31 are turned on. Moreover, the switch elements 140, 141 are turned off. Therefore, the inverter 34 operates using VCGNW and VCGPW as a power supply voltage. The potential of the VCGPW node is always 0 V. Since the output of the NAND gate 33 corresponding to the selected word line (in FIG. 7, word line WL0) is at the low level, the output of the inverter 34 is at VDDW=Vpp (the potential at the VCGNW node). On the other hand, since the outputs of the NAND gates 33 corresponding to the unselected word lines are at the high level, the outputs of the corresponding inverters 34 are at 0 V (the potential of the VCGPW node). As a result, the potential of the selected word line is at VCGNW=Vpp, whereas the potentials of the unselected word lines are at VCGPW= 0 V. In addition, since the control signal WSG is set at the high level (Vcc2), all of the p-channel MOS transistors 37 are turned on. The control signal ZISOG is set at the low level (0 V) in a write operation, which brings the p-channel MOS transistor 48 into the off state.

At time t1 when the voltage VDDW reaches Vpp, the boosting circuit 130 boosts the generated voltage VNEG from 0 V to VBB (−8 V). Moreover, the switch element 142 is turned on. Then, the control circuit 100 supplies the voltage VNEG generated by the boosting circuit 130 via the switch element 142 to the p-well region 156 where the memory cell array 20 is formed. As a result, the potential VPW of the p-well region 156 becomes VBB. The voltage VNEG is also supplied to the VSGPW node. The switch element 143 connects the VSGPW node to the p-channel MOS transistor 37. Thus, the potentials of the impurity diffused layer and back gate of the p-channel MOS transistor 37 also become VBB. Then, since the p-channel MOS transistor 37 is in the on state, the potentials of all of the select gate lines SG0 to SG(4m−1) become VNEG=VBB. Therefore, the select transistor ST is turned off. At this point in time, the path from the switch element 142 to the memory cell array 20 is isolated from the VSGPW node by the switch element 143. That is, although the well potential VPW and the potential of the select gate are both at VBB, VBB is supplied to them in different paths.

As described above, Vpp is supplied to the selected word line WL0, 0 V is supplied to the unselected word lines, VBB is supplied to all of the select gate lines SG0 to SG(4m−1), and VBB is supplied to the well region 156. In this state, either 0 V or −8 V is applied to the local bit line LBL0, thereby writing the data into the memory cell MC connected to the word line WL0 (time t2 to time t3).

After the data is written from time t2 to time t3, the word line WL0, select gate lines SG0 to SG(4m−1), and well potential VPW are returned to 0 V. Before they are returned to 0 V, the word line WL0 and well potential VPW are brought into the floating state. This is shown in FIG. 6 from time t3 to time t4 and in FIG. 8. Specifically, in the row address decode circuit 31, the switch 35 of the inverter 34 corresponding to the selected word line WL0 is turned off. In this state, the source of the p-channel MOS transistor 38 shown in FIG. 4 is connected to neither the VCGNW node nor the control circuit 100. Therefore, the output of the inverter 34, that is, the potential of the word line WL0, is in the floating state. In addition, the switch 142 is turned off. As a result, none of them supply a voltage to the p-well 156 where memory cells are formed, which brings the p-well 156 into the floating state. VBB is still supplied to the select gate line and 0 V is still supplied to the unselected word lines.

After the potentials of the selected word line WL0 and p-well region 156 are placed in the floating state, the word line WL0 and the p-well region 156 are short-circuited. This is shown in FIG. 6 from time t4 to time t5 and in FIG. 9. Specifically, in the row address decode circuit 31, the switch 36 of the inverter 34 corresponding to the selected word line WL0 is turned off. Then, the switches 140, 141 connected to the inverter 34 corresponding to the selected word line WL0 are turned on. In this state, the source of the p-channel MOS transistor 38 of FIG. 4 is connected to the control circuit 100. Moreover, the switch 142 is turned on, which connects the p-well 156 to the control circuit 100. As a result, the word line WL0 and the p-well 156 are connected electrically. In this embodiment, in the control circuit 100, the node connected to the word line WL0 is short-circuited to the node connected to the potential VPW of the p-well region 156. After they are short-circuited, their potentials approach almost the same potential. The reason why the selected word line WL0 and the p-well region 156 are brought into the floating state is that they have to be short-circuited as described above. If they were short-circuited without bringing them into the floating state, the outputs (positive potential Vpp and negative potential VBB) of the boosting circuits 120, 130 would be short-circuited, which might destroy the flash memory.

From time t4 to time t5, the switch element 143 disconnects the select gate lines SG0 to SG(4m−1) from the VSGPW node. Then, it connects the path from the switch element 142 to the p-well 156 to the select gate lines SG0 to SG(4m−1). As a result, the potentials of the select gate lines SG0 to SG(4m−1) change as does the potential VPW of the p-well region 156.

As described above, from time t4 to time t5 the potential difference between the p-well region 156 and the selected word line WL0 and the potential difference between the p-well region 156 and the select gate lines SG0 to SG(4m−1) are made sufficiently small. After the potential differences become so small that they have no effect on the gate withstand voltage of the select transistor ST (time t5), the control circuit 100 supplies 0 V to the word line WL0, p-well 156, and select gate lines SG0 to SG(4m−1) in the state shown in FIG. 9.

As a result, all of the word lines WL0 to WL(4m−1), all of the select gate lines SG0 to SG(4m−1), and p-well region 156 are at 0 V, which completes the write operation. After the write operation is completed, the boosting circuit 130 returns the generated voltage VNEG to 0 V and the boosting circuit 120 returns the generated voltage VDDW to Vcc2. As a result, the potential of the VSGPW node also returns to 0 V. Furthermore, the control signal WSG is set at the low level, which turns off the p-channel MOS transistor 37.

<Erase Operation>

Figure 10:
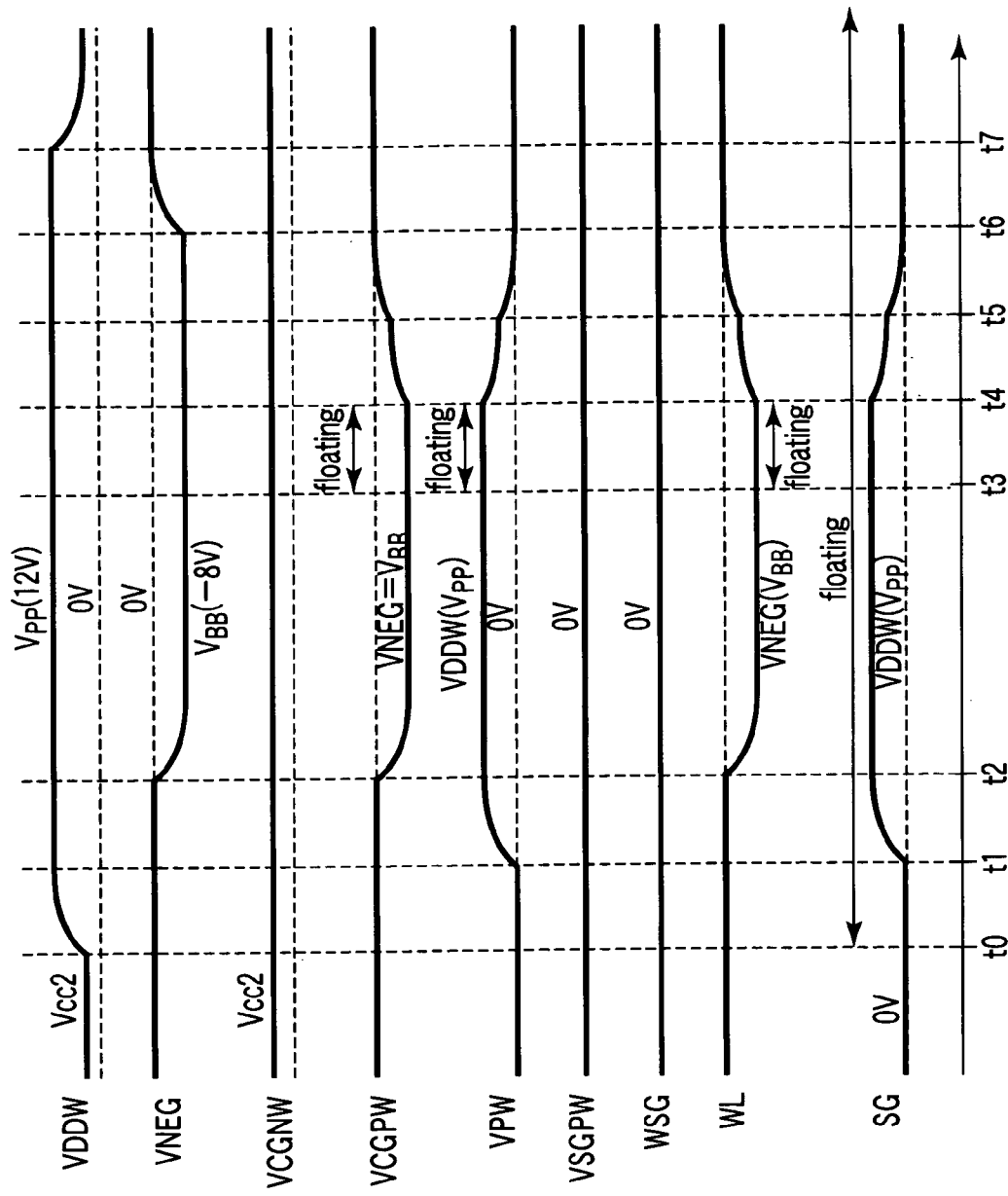
FIG. 10 is a timing chart of various signals in an erase operation of the flash memory of the first embodiment.
Figure 11:
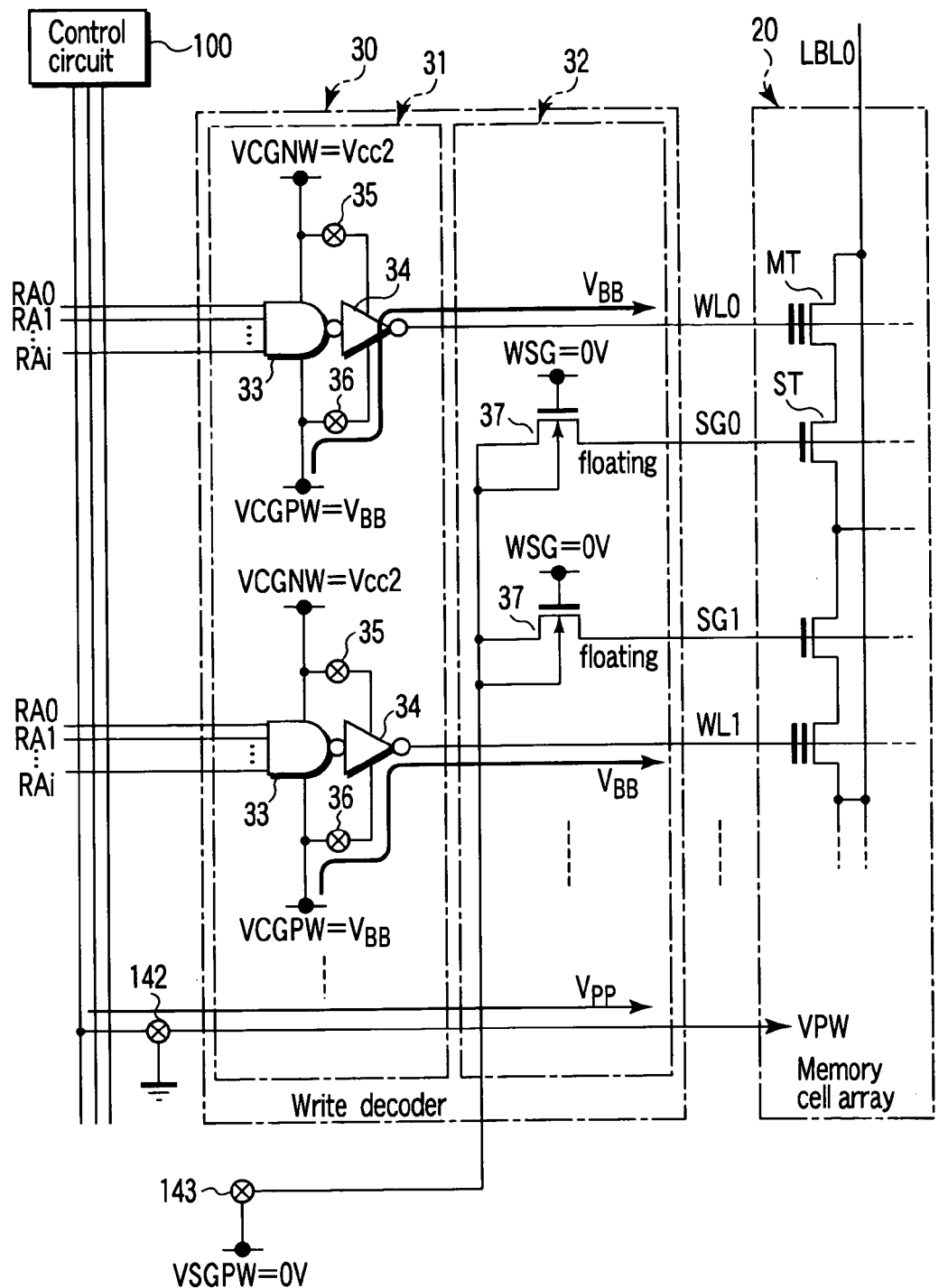
Figure 12:
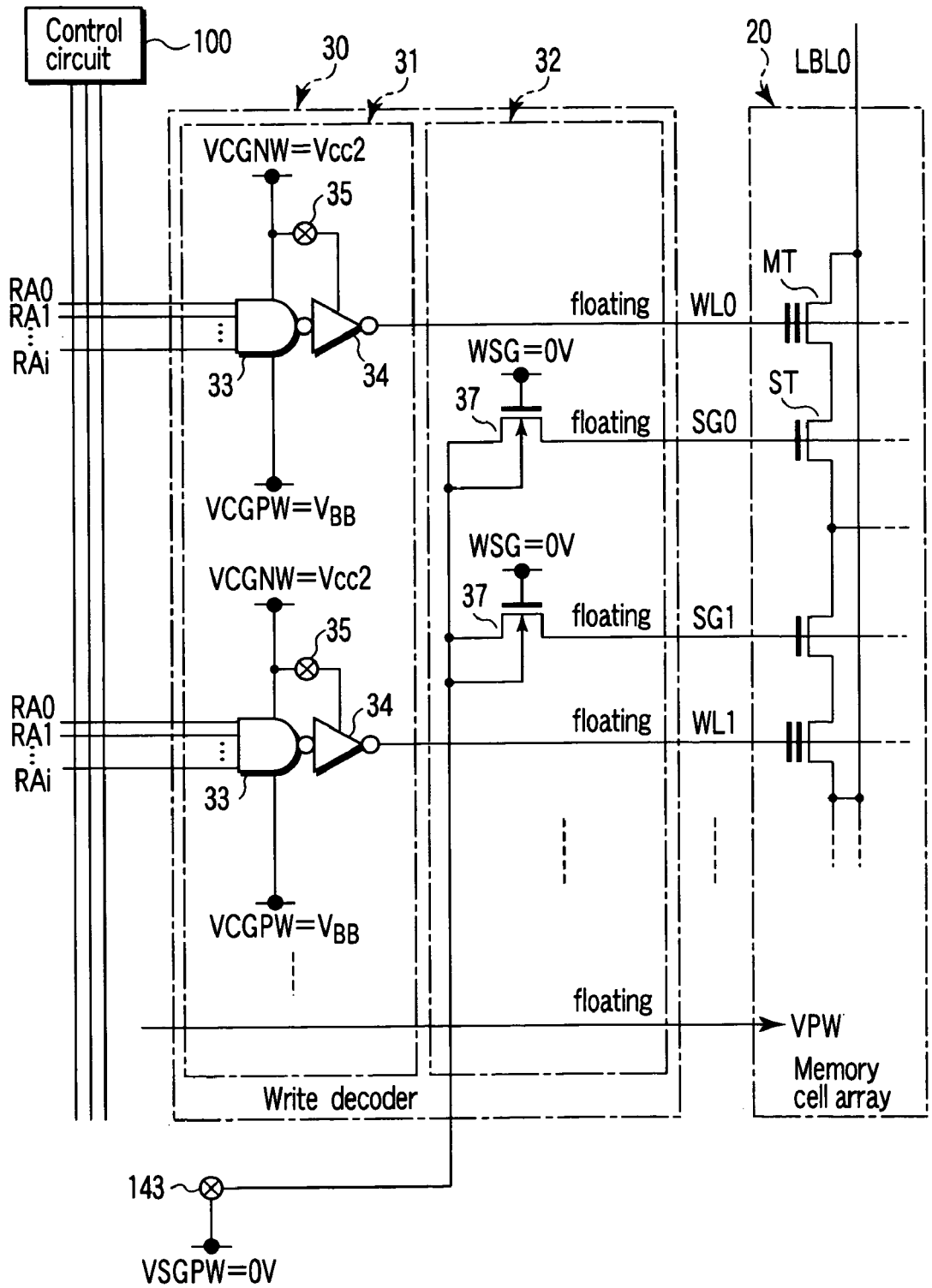

Next, an erase operation will be explained by reference to FIGS. 10 to 13. FIG. 10 is a timing chart for the potentials and various signals at the individual nodes. FIGS. 11 to 13 are circuit diagrams of a part of the write decoder 30 and memory cell array 20.

First, in FIG. 10, an erase operation is started at time t0. FIG. 11 shows a state from time t1 to time t3 Hereinafter, explanation will be given by reference to FIGS. 10 and 11. First, the boosting circuit 120 boosts the generated voltage VDDW from Vcc2 to Vpp. The switch elements 140, 141 are turned off. At time t1, the control circuit 100 supplies the voltage VDDW generated by the boosting circuit 120 via the switch element 142 to the p-well region 156 where the memory cell array 20 is formed. As a result, the potential VPW of the p-well region 156 becomes Vpp.

At time t2 when the potential VPW reaches Vpp, the boosting circuit 130 boosts the generated voltage VNEG from 0 V to VBB (−8 V). The voltage VNEG generated by the boosting circuit 130 is supplied to the VCGPW node. Thus, the potential at the VCGPW node also rises to VBB. The potential at the VCGNW node is always kept at Vcc2 Moreover, the switch elements 35, 36 in the row address decode circuit 31 are turned on. Thus, the inverter 34 operates using the VCGNW (Vcc2) and VCGPW (VBB) as a power supply voltage.

In an erase operation, since the outputs of the NAND gates 33 corresponding to all of the word lines WL0 to WL(4m−1) are at the high level, the output of the inverter 34 is at VNEG=VBB (the potential at the VCGPW node). As a result, the potential of the word line becomes VCGPW=VBB. In addition, since the control signal WSG is set at the low level (0 V), all of the p-channel MOS transistors 37 are turned off. The control signal ZISOG is set at the low level (0 V) in a write operation, which turns off all of the p-channel MOS transistors 48. As a result, all of the select gate lines SG0 to SG(4m−1) are brought into the floating state. At this time, the path from the switch element 142 to the memory cell array 20 is isolated from the VSGPW node by the switch element 143. The potential of the VSGPW node is always kept at 0 V.

As described above, VBB is supplied to all of the word lines WL0 to WL(4m−1), all of the select gate lines SG0 to SG(4m−1) are brought into the floating state, and Vpp is supplied to the well region 156. As a result, electrons are pulled out of the floating gate of the memory cell transistor MT, thereby erasing the data (time t2 to time t3)

After the data is erased from time t2 to time t3) the word lines WL0 to WL(4m−1) and well potential VPW are returned to 0 V. Before they are returned to 0 V, the word lines WL0 to WL(4m−1) and well potential VPW are brought into the floating state (with the select gate line remaining in the floating state). This is shown in FIG. 10 from time t3 to time t4 and in FIG. 12. Specifically, in the row address decode circuit 31, the switches 36 of the inverters 34 corresponding to the individual word lines WL0 to WL(4m−1) are turned off. In this state, the source of the n-channel MOS transistor 39 shown in FIG. 4 is connected to neither the VCGPW node nor the control circuit 100. Thus, the outputs of the inverters 34, that is, the potentials of the word lines WL0 to WL(4m−1), are in the floating state. Moreover, the switch 142 is turned off. As a result, none of them supply a voltage to the p-well 156 where the memory cells are formed, which brings the p-well 156 into the floating state.

As described above, after the potentials of the word lines WL0 to WL(4m−1) and p-well region 156 are brought into the floating state, the word lines WL0 to WL(4m−1) are short-circuited to the p-well region 156. This is shown in FIG. 10 from time t4 to time t5 and in FIG. 13. Specifically, in the row address decode circuit 31, the switch 36 is also turned off. Then, the switches 140, 141 are turned on. In this state, the source of the n-channel MOS transistor 39 in FIG. 4 is connected to the control circuit 100. Then, the switch 142 is turned on, which connects the p-well 156 to the control circuit 100. As a result, the word lines WL0 to WL(4m−1) and the p-well region 156 are connected electrically. In this embodiment, in the control circuit 100, the nodes connected to the word lines WL0 to WL(4m−1) are short-circuited to the node connected to the potential VPW of the p-well region 156. After they are short-circuited, their potentials approach almost the same potential. Since the select gate lines SG0 to SG(4m−1) are always in the floating state, the coupling permits their potentials to vary as does the potential VPW of the p-well region 156.

As described above, from time t4 to time t5 the potential difference between the p-well region 156 and the word lines WL0 to WL(4m−1) is made sufficiently small. When the potential difference becomes so small that it has no effect on the gate withstand voltage of the select transistor ST (time t5), the control circuit 100 supplies 0 V to the word lines WL0 to WL(4m−1), and p-well 156.

As a result, all of the word lines WL0 to WL(4m−1), all of the select gate lines SG0 to SG(4m−1), and p-well region 156 are at 0 V, which completes the erase operation. After the erase operation is completed, the boosting circuit 130 returns the generated voltage VNEG to 0 V and the boosting circuit 120 returns the generated voltage VDDW to Vcc2.

As described above, the flash memory according to the first embodiment produces the following effect.

(1) The Reliability of the Operation of the Flash Memory is Improved.

With the configuration of the first embodiment, after the write operation and after the erase operation, the selected word line and the well region where the memory cells are formed are brought into the floating state. Then, after they are brought in the floating state, they are short-circuited to each other, thereby making the potential difference smaller. Furthermore, after the potential difference becomes so small that the coupling between the word lines and the well region is almost no problem, 0 V is applied to the word lines and the well region. Therefore, when the word lines and the well region are returned to 0 V, the coupling between the word lines and the well region has almost no effect. As a result, it is possible to suppress the occurrence of the dielectric breakdown of the gate insulating film of the memory transistor or the occurrence of an erroneous operation in the peripheral circuit caused by a forward bias state induced in the semiconductor elements in the write decoder.

Furthermore, from the beginning to the end of writing, the select gate lines and the well region where the memory cells are formed are always kept at the same potential. In addition, from the beginning and the end of erasing, the select gate lines are always in the floating state. Therefore, when the selected word line and the well region are returned to 0 V, the potentials of the select gate lines vary, as does the potential of the well region. Accordingly, the coupling between the select gate lines and the well region becomes no problem. Furthermore, they are always at the same potential, no stress is applied to the gate insulating film of the select transistor, which suppresses the occurrence of dielectric breakdown. As described above, it is possible to suppress the influence of a change in the potential of the select gate line caused by coupling to an erroneous operation in the write decoder.

As a result, the reliability of the operation of the flash memory is improved.

Next, a nonvolatile semiconductor memory device according to a second embodiment of the present invention will be explained. The second embodiment is such that the switch element group 32 in the write decoder 30 and the memory cell array 20 in the first embodiment are formed in a same well region. FIG. 14 is a circuit diagram of a part of a flash memory 10 according to the second embodiment. More particularly, FIG. 14 is a detailed circuit diagram of the write decoder 30 and the select decoder 40. FIG. 15 is a sectional view of a part of the memory cell array 20, select gate decoder 40, and write decoder 30 of FIG. 14. FIG. 14 shows only a single memory cell MC, inverters 34, 47, and MOS transistors 37, 48. Since the configuration of the flash memory and the circuit configuration of the memory cell array 20 are the same as those in the first embodiment, explanation will be omitted.

As shows in the figures, the memory cells MCs and the p-channel MOS transistors 37 in the switch element group 32 are formed on a p-well region 158 formed at the surface of an n-well region 152. Thus, the back gate bias of the p-channel MOS transistor 37 is at the same potential as the potential VPW of the p-well region 158. The potential of one end (the one not connected to the select gate line) of the current path of the p-channel MOS transistor 37, which is also at the same potential as the potential VPW, is connected to the control circuit 100 via the switch element 142. The switch element 143 in the first embodiment is omitted. The remaining configuration is the same as that of the first embodiment.

Next, the write operation and erase operation in the flash memory of the second embodiment will be explained in detail, centering on the write decoder 30. What differs from the first embodiment will be explained in detail in particular. Since the read operation is the same as in the first embodiment, explanation will be omitted.

<Write Operation>

Figure 17:
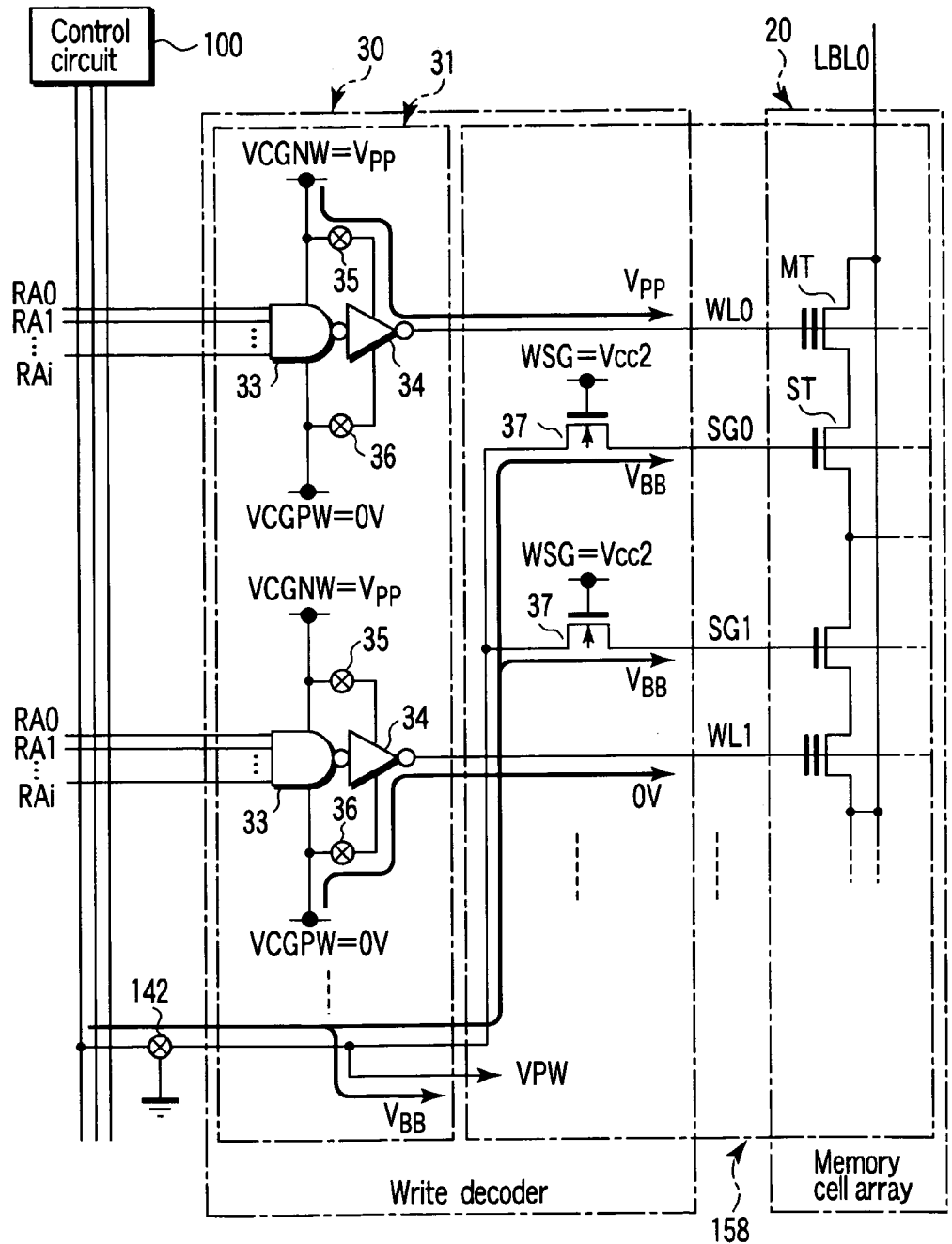

In FIG. 16, suppose a write operation is started at time t0. FIG. 17 shows a state from time t1 to time t3 Hereinafter, explanation will be given by reference to FIG. 16 and FIG. 17. First, the boosting circuit 120 boosts the generated voltage VDDW from Vcc2 to Vpp (12 V). The operation of the write decoder 30 is the same as in the first embodiment. That is, the potential at the VCGNW node also rises to Vpp. Moreover, the switch elements 35, 36 in the row address decode circuit 31 are turned on and the switch elements 140, 141 are turned off. Therefore, the inverter 34 operates using VCGNW (Vpp) and VCGPW (0 V) as a power supply voltage. Thus, the potential of the selected word line (in FIG. 17, word line WL0) is at VCGNW=Vpp and the potentials of the unselected word lines are at VCGPW=0 V. Since the control signal WSG is set at the high level (Vcc2), all of the p-channel MOS transistors 37 are turned on. The p-channel MOS transistor 48 is in the off state.

At time t1 when the voltage VDDW reaches Vpp, the boosting circuit 130 boosts the generated voltage VNEG from 0 V to VBB (−8 V). Moreover, the switch element 142 is turned on. Then, the control circuit 100 applies the voltage VNEG generated at the boosting circuit 130 via the switch element 142 to the p-well region 158 where the memory cell array 20 and the p-channel MOS transistor 37 are formed. Of course, the voltage VNEG is also applied to one end of the current path of the p-channel MOS transistor 37. As a result, the potential VPW of the p-well region 158 and the potentials of the select gate lines SG0 to SG(4m−1) become VBB.

As described above, Vpp is supplied to the selected word line WL0, 0 V is applied to the unselected word lines, VBB is supplied to all of the select gate lines SG0 to SG(4m−1), and VBB is supplied to the well region 158. In this state, the data is written into the memory cell MC (time t2 to time t3)

Figure 18:
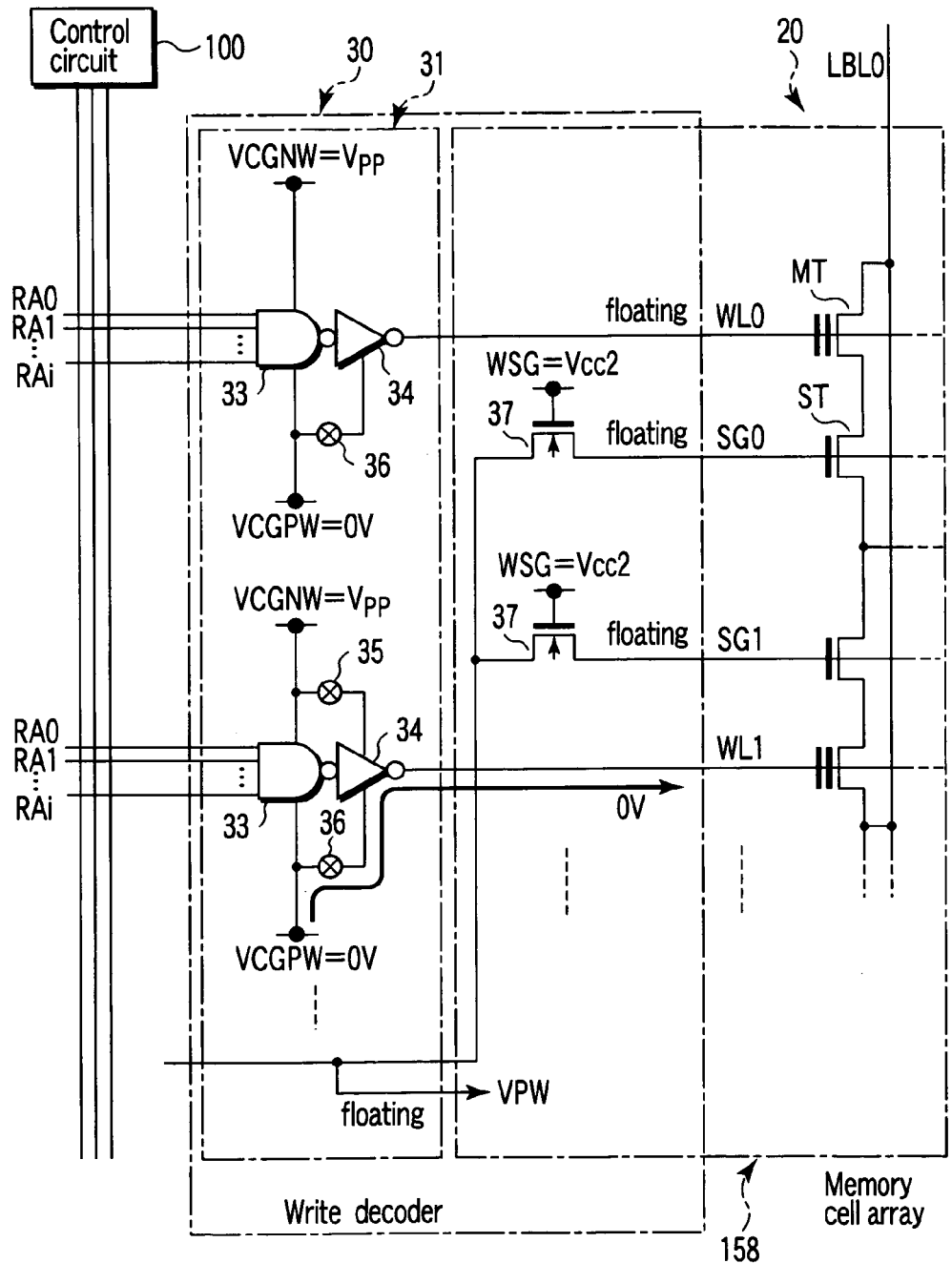

After the data is written from time t2 to time t3) the word line WL0, select gate lines SG0 to SG(4m−1), and well potential VPW are returned to 0 V. Before they are returned to 0 V, the word line WL0, well potential VPW, and select gate lines SG0 to SG(4m−1) are brought into the floating state. This is shown in FIG. 6 from time t3 to time t4 and in FIG. 18. Specifically, in the row address decode circuit 31, the switch 35 of the inverter 34 corresponding to the selected word line WL0 is turned off. Therefore, the potential of the word line WL0 is in the floating state. In addition, the switch 142 is turned off. As a result, none of them supply a voltage to the p-well region 158 and select gate lines SG0 to SG(4m−1), which brings the p-well region 158 and select gate lines SG0 to SG(4m−1) into the floating state.

After the selected word line WL0, the potential VPW of the p-well region 158, and the select gate lines SG0 to SG(4m−1) are placed in the floating state, the word line WL0, the p-well region 158, and the select gate lines SG0 to SG(4m−1) are short-circuited. This is shown in FIG. 16 from time t4 to time t5 and in FIG. 19. Specifically, in the row address decode circuit 31, the switch 36 of the inverter 34 corresponding to the selected word line WL0 is turned off. Then, the switches 140, 141 connected to the inverter 34 corresponding to the selected word line WL0 are turned on. Moreover, the switch 142 is turned on, which connects the p-well region 158 and the select gate lines SG0 to SG(4m−1) to the control circuit 100. As a result, the word line WL0, p-well region 158, and select gate lines SG0 to SG(4m−1) are connected electrically. In this embodiment, in the control circuit 100, the node connected to the word line WL0 is short-circuited to the node connected to the p-well region 158 and one end of the current path of the p-channel MOS transistor 37. After they are short-circuited, the potentials of the three approach almost the same potential.

As described above, from time t4 to time t5 the potential difference between the p-well region 158 and the selected word line WL0 is made sufficiently small. The potential difference between the p-well region 158 and the select gate lines SG0 to SG(4m−1) is almost zero from the beginning. After the potential difference between the p-well region 158 and the selected word line WL0 becomes sufficiently small (time t5), the control circuit 100 supplies 0 V to the word line WL0, p-well 158, and select gate lines SG0 to SG(4m−1) in the state shown in FIG. 19.

As a result, all of the word lines WL0 to WL(4m−1), all of the select gate lines SG0 to SG(4m−1), and p-well region 158 are at 0 V, which completes the write operation.

<Erase Operation>

Figure 20:
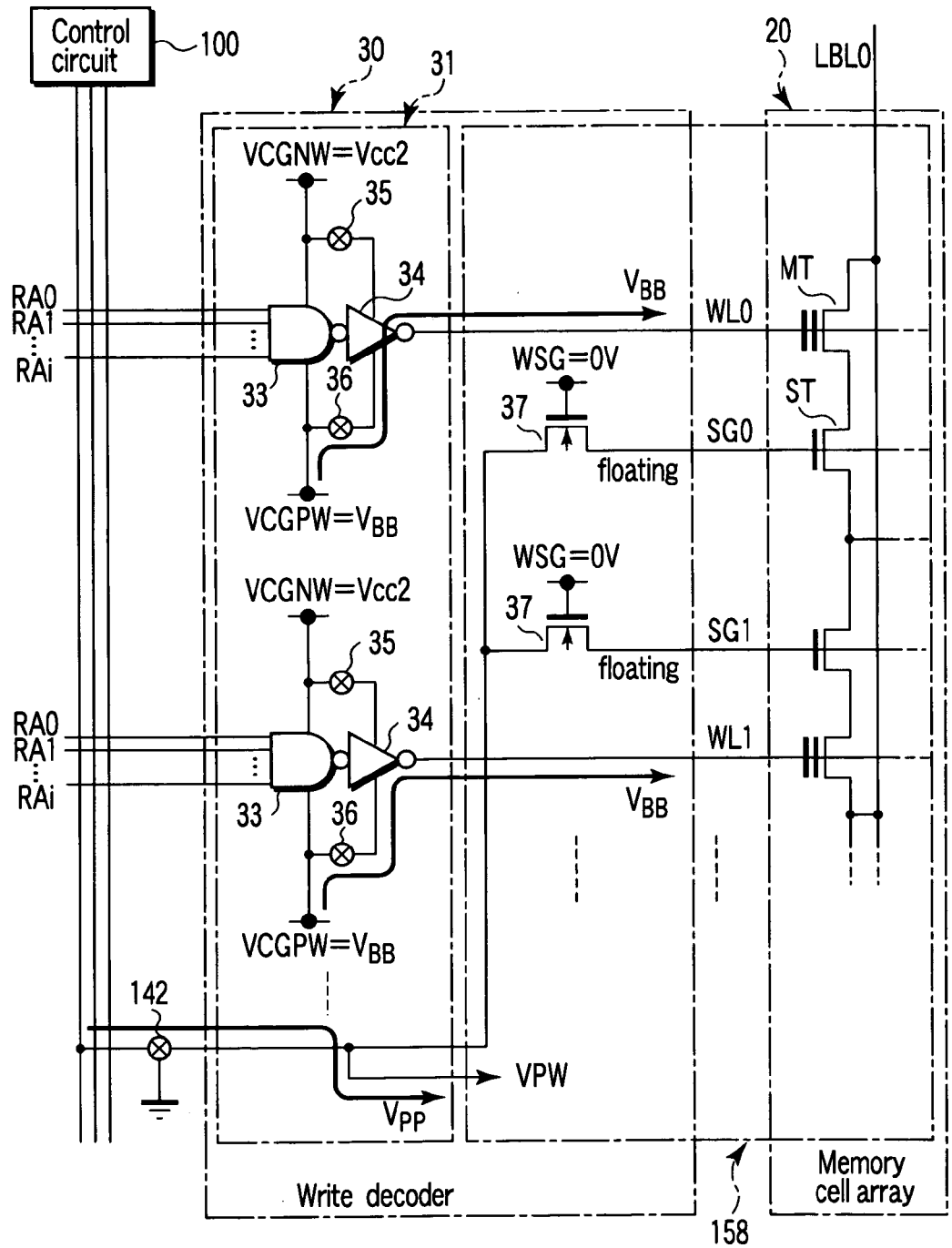

Next, an erase operation will be explained by reference to FIGS. 20 to 22. FIGS. 20 to 22 are circuit diagrams of a part of the write decoder 30 and memory cell array 20. A timing chart for the potentials and various signals at the individual nodes is the same as that of FIG. 10 except for VSGPW.

First, in FIG. 10, suppose an erase operation is started at time t0. FIG. 20 shows a state from time t1 to time t3 First, the boosting circuit 120 boosts the generated voltage VDDW from Vcc2 to Vpp. The switch elements 140, 141 are turned off. At time t1, the control circuit 100 applies the voltage VDDW generated at the boosting circuit 120 via the switch element 142 to the p-well region 158. As a result, the potential VPW (back gate bias of the p-channel transistor 37) of the p-well region 158 becomes Vpp. Since the control signal WSG is set at the low level (0 V), all of the p-channel MOS transistors 37 are in the off state. This brings the select gate lines SG0 to SG(4m−1) into the floating state.

At time t2 when the potential reaches Vpp, the boosting circuit 130 boosts the generated voltage VNEG from 0 V to VBB (−8 V). The voltage VNEG generated at the boosting circuit 130 is supplied to the VCGPW node. The potential at the VCGNW node is always kept at Vcc2 Moreover, the switch elements 35, 36 in the row address decode circuit 31 are turned on. Thus, the inverter 34 operates using the VCGNW (Vcc2) and VCGPW (VBB) as a power supply voltage.

In an erase operation, the outputs of the NAND gates 33 corresponding to all of the word lines WL0 to WL(4m−1) are at the high level. As a result, the potentials of the word lines become VCGPW=VBB.

As described above, VBB is supplied to all of the word lines WL0 to WL(4m−1), all of the select gate lines SG0 to SG(4m−1) are brought into the floating state, and Vpp is applied to the well region 158. As a result, electrons are pulled out of the floating gate of the memory cell transistor MT, thereby erasing the data (time t2 to time t3)

After the data is erased from time t2 to time t3) the word lines WL0 to WL(4m−1) and well potential VPW are returned to 0 V. Before they are returned to 0 V, the word lines WL0 to WL(4m−1) and well potential VPW are brought into the floating state (with the select gate line remaining in the floating state). This is shown in FIG. 10 from time t3 to time t4 and in FIG. 21. Specifically, in the row address decode circuit 31, the switches 36 are turned off. Thus, the outputs of the inverters 34, that is, the potentials of the word lines WL0 to WL(4m−1), are in the floating state. Moreover, the switch 142 is turned off. This brings the p-well 158 into the floating state.

As described above, after the potentials of the word lines WL0 to WL(4m−1) and p-well region 158 are brought into the floating state, the word lines WL0 to WL(4m−1) are short-circuited to the p-well region 158. This is shown in FIG. 10 from time t4 to time t5 and in FIG. 22. Specifically, in the row address decode circuit 31, the switches 36 are also turned off. Then, the switches 140, 141 are turned on. Moreover, the switch 142 is turned on, which connects the p-well 158 to the control circuit 100. As a result, the word lines WL0 to WL(4m−1) and the p-well region 158 are connected electrically. In this embodiment, in the control circuit 100, the nodes connected to the word lines WL0 to WL(4m−1) are short-circuited to the node connected to the potential VPW of the p-well region 158. After they are short-circuited, their potentials approach almost the same potential.

As described above, from time t4 to time t5 after the potential difference between the p-well region 158 and the word lines WL0 to WL(4m−1) is made sufficiently small from time t4 to time t5 (time t5), the control circuit 100 supplies 0 V to the word lines WL0 to WL(4m−1) and p-well 158 in the state shown in FIG. 22.

As a result, all of the word lines WL0 to WL(4m−1), all of the select gate lines SG0 to SG(4m-1), and p-well region 158 are at 0 V, which completes the erase operation. After the erase operation is completed, the boosting circuit 130 returns the generated voltage VNEG to 0 V and the boosting circuit 120 returns the generated voltage VDDW to Vcc2.

As described above, with the flash memory according to the second embodiment, the switch element group 32 and the memory cells MCs are formed in the same single p-well region 158. In this case, too, the effect in item (1) is obtained as in the first embodiment. Furthermore, the following effect in item (2) is also obtained.

(2) The flash memory manufacturing processes can be simplified.

In the second embodiment, the switch element group 32 and the memory cells MCs are formed in the same p-well region 158. Therefore, the number of p-well regions decreases, which helps simplify the manufacturing processes.

Furthermore, the select gate lines SG0 to SG(4m−1) are connected to the p-well region 158. In other words, the potentials of the select gate lines SG0 to SG(4m−1) are supplied from the control circuit 100 via the switch element 142 and pass through the path reaching the p-well region. Specifically, the paths for supplying a potential to the select gate lines SG0 to SG(4m−1) also serve as the paths for supplying a potential to the p-well region 158. Consequently, neither the switch element 143 needed in the configuration of the first embodiment nor the path connecting the path from the control circuit 100 to the p-well region 158 and the switch element 143 is necessary. Consequently, the circuit configuration is simplified and therefore the manufacturing processes are simplified. As a result, the manufacturing cost of flash memory can be reduced.

Figure 23:
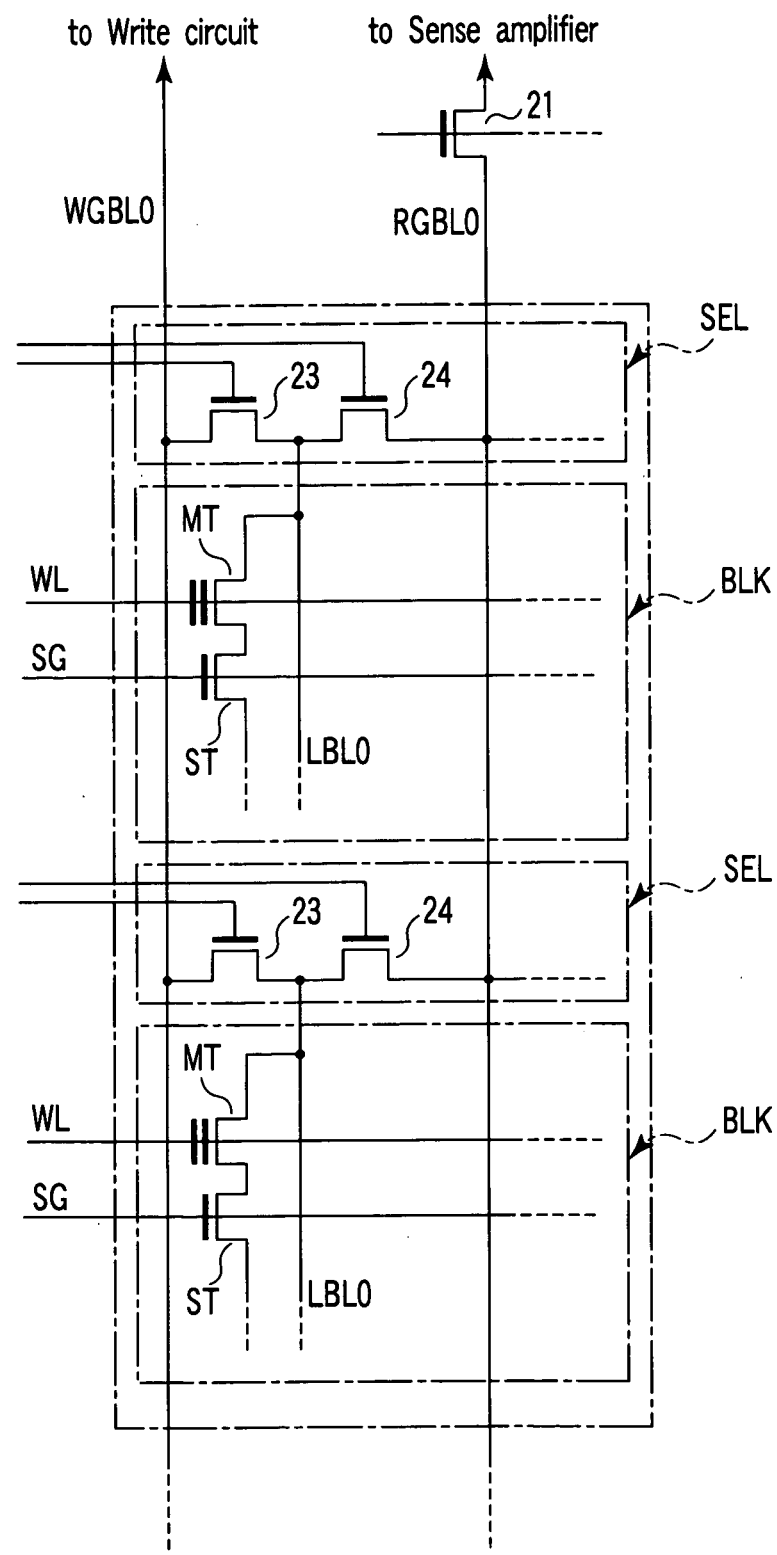
FIG. 23 is a circuit diagram of a part of the memory cell array according to a third embodiment of the present invention.
Figure 24:
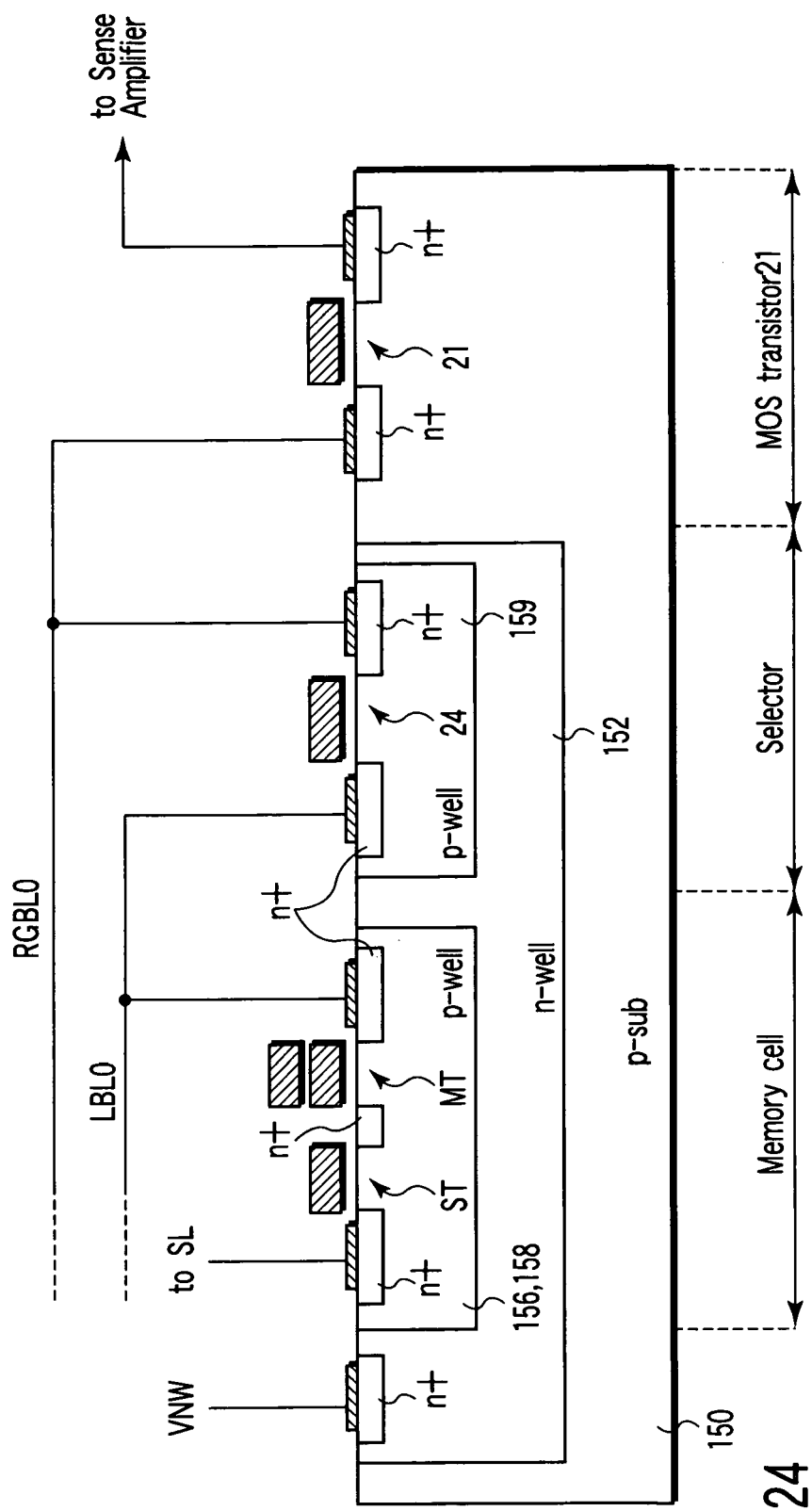
FIG. 24 is a sectional view of a part of the memory cell array provided in the flash memory of the third embodiment.

Next, a nonvolatile semiconductor memory device according to a third embodiment of the present invention will be explained. The third embodiment is related to the configuration of the column system circuit in the first and second embodiments. FIG. 23 is a circuit diagram of a part of the memory cell array 20 provided in a flash memory according to the third embodiment. FIG. 23 particularly shows memory cell blocks BLKs, selectors SELs, and an n-channel MOS transistor 21. FIG. 24 is a sectional view of the memory cell array shown in FIG. 23. FIG. 24 shows only a memory cell MC, a MOS transistor 24 in a selector SEL, and an n-channel MOS transistor 21. Since the remaining configuration is the same as that of each of the first and second embodiments, explanation will be omitted.

As shown in the figures, the MOS transistors 23 to 26 in the selector SEL are formed in the p-well region 159 formed at the surface of the n-well region 152. The p-well region 159 is isolated from the p-well region 156 or p-well region 158. The n-channel MOS transistor 21 is formed on the p-type semiconductor substrate 150 in a region isolated from the p-well regions 156, 158, 159 by the n-well region 152.

The configuration of the third embodiment produces not only the effects in items (1) and (2) explained in the first and second embodiments but also the following effect in item (3).

(3) The Read Operation of the Flash Memory can be Speeded Up.

The flash memory handles relatively high voltages, such as −8V or 12 V, in a write operation. To meet this requirement, it is necessary to use high-withstand-voltage MOS transistors with a thick gate insulating film. From the viewpoint of operating speed, it is desirable to use low-withstand-voltage MOS transistors with a thin gate insulating film.

In this respect, with the configuration of the third embodiment, a MOS transistor 21 is isolated from a selector SEL and a memory block BLK by a well. Accordingly, a low-withstand-voltage MOS transistor can be used as the MOS transistor 21. This helps step up the read operation speed.

As described above, a flash memory according to each of the first to third embodiments can suppress the occurrence of an erroneous operation caused by the coupling between the word lines and the well region where the memory cells are formed. Furthermore, the coupling between the select gate lines and the well region where the memory cells are formed becomes no problem. Therefore, the reliability of the operation of the flash memory is improved.

In the first to third embodiments, the bit lines have been organized into the global bit lines and the local bit lines in a hierarchical manner. However, it goes without saying that the embodiment may be applied to a case where the bit lines are not organized hierarchically. When the bit lines are organized hierarchically, the parasitic capacitance on the write global bit lines and read global bit lines can be reduced, which improves the operating speed of the flash memory. In addition, the occurrence of erroneous writing into a memory cell connected to an unselected local bit line is prevented effectively, which improves the reliability of the write operation.

Furthermore, in the first to third embodiments, the flash memory has memory cells, each including two transistors, a select transistor ST and a memory cell transistor MT. The first to third embodiments may be applied to a NAND flash memory. FIG. 25 is a block diagram of a NAND flash memory according to a first modification of each of the first to third embodiments.

As shown in FIG. 25, a memory cell array 20 includes a plurality of NAND cells. Each of the NAND cells has two select transistors ST1, ST2 and a plurality of memory cell transistors MT. While in FIG. 25, an explanation of eight memory cell transistors is given, the number of memory cell transistors is not limited to that number and may be 16 or 32. The memory cell transistors MT are connected in series between the source of the select transistor ST1 and the drain of the select transistor ST2. Then, the drain regions of the select transistors ST1 in a same column are connected in common to a bit line. The source regions of the select transistors ST2 are connected to the source lines. The memory cell transistor MT and select transistors ST1, ST2 have a stacked gate formed on a semiconductor substrate with a gate insulating film interposed therebetween. The stacked gate includes a floating gate formed on the gate insulating film and a control gate formed on the floating gate with an inter-gate insulating film interposed therebetween. Then, in the memory cell transistors MT, the floating gates are isolated from one another from one transistor to another. In the select transistors ST1, ST2, the floating gates adjacent to each other in the word line direction are connected in common. Moreover, in the select transistors ST1, ST2, the floating gate and control gate are connected electrically. Then, the control gates of the memory cell transistors in a same row are connected in common to a word line. The control gates of the select transistors ST1, ST2 in a same row are connected in common to select gate lines SGG, SGS, respectively. The remaining configuration is the same as that of each of the first to third embodiments.

The first to third embodiments are also applicable to the above NAND flash memory.

Figure 26:
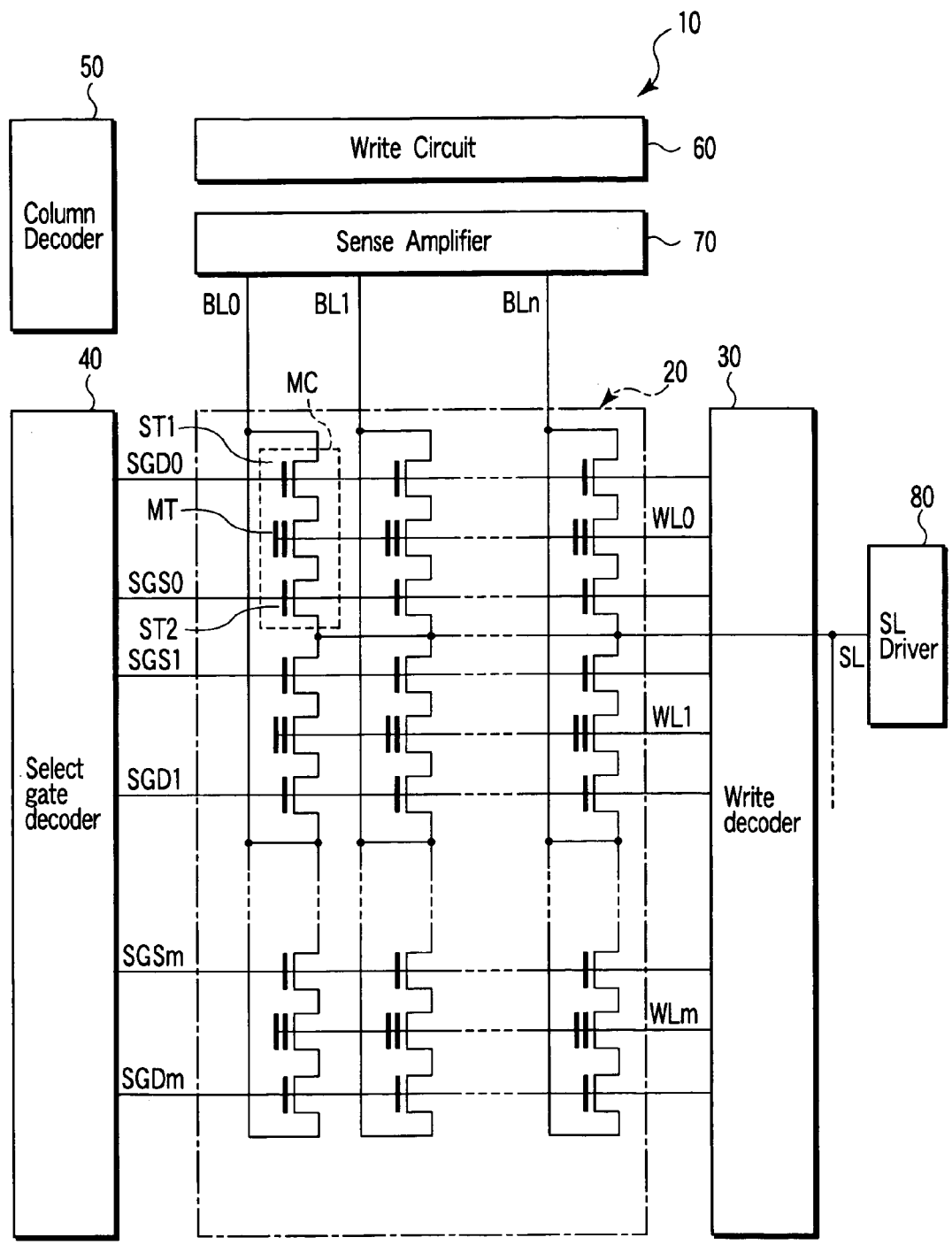
FIG. 26 is a block diagram of a flash memory according to a second modification of each of the first to third embodiments.

Furthermore, the first to third embodiment may be applied to a flash memory with memory cells, each including two select transistors ST, ST2 and a memory cell transistor MT. FIG. 26 is a block diagram of a flash memory according to a second modification of each of the first to third embodiments.

As shown in FIG. 26, a memory cell array 20 has a plurality of memory cells MCs arranged in a matrix. Each of the memory cells includes two select transistors ST1, ST2, and a memory cell transistor MT. These three transistors are connected in series in such a manner that the memory cell transistor MT is sandwiched between the two select transistors ST1, ST2. The drain regions of the select transistors ST1 in a same column are connected equally to a bit line. The source regions of the select transistors ST2 are connected to source lines. Each of the memory cell transistors MT and select transistors ST1, ST2 has a stacked gate formed on a semiconductor substrate with a gate insulating film interposed therebetween. The stacked gate includes a floating gate formed on the gate insulating film and a control gate formed on the floating gate with an inter-gate insulating film interposed therebetween. In the memory cell transistors MT, the floating gates are insolated from one transistor to another. In the select transistors ST1, ST2, the floating gates adjacent to each other in the word line direction are connected in common. Moreover, in each of the select transistors ST1, ST2, the floating gate and the control gate are connected electrically. The control gates of the memory cell transistors MT in a same row are connected in common to a word line. The control gates of the select transistors ST1 in a same row are connected in common to the select gate line SGD. The control gate of the select transistors ST2 in the same row are connected in common to the select gate line SGS. The remaining configuration is the same as that of each of the first to third embodiments.

The first to third embodiments are also applicable to the above memory.

Figure 27:
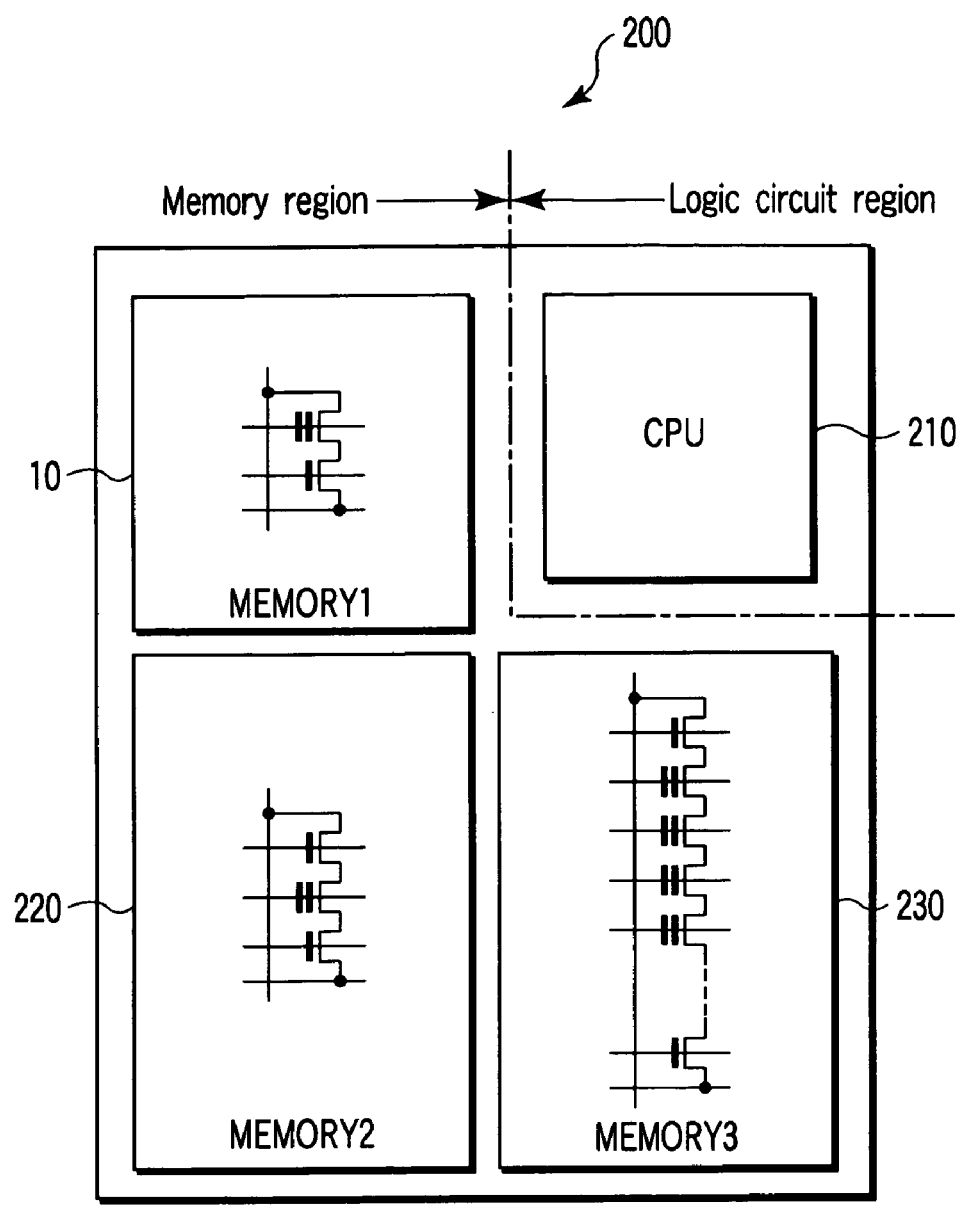
FIG. 27 is a block diagram of a flash memory according to a third modification of each of the first to third embodiments.

Furthermore, the first to third embodiments may also be applied to a system LSI. FIG. 27 is a block diagram of a system LSI according to a third modification of each of the first to third embodiments.

As shown in FIG. 27, a system LSI 200 has a logic circuit region and a memory region. In the logic circuit region, for example, a CPU 210 is provided. In the memory region, there are provided a flash memory 10 explained in each of the fist to third embodiments, a flash memory 220 including three MOS transistors explained in FIG. 26, and a NAND flash memory 230 explained in FIG. 25. Each of the memory cells in the flash memory 10 has two transistors connected in series, which leads to a higher current driving capability than that of the other memory cells. Therefore, the flash memory 10 is suitable for high-speed reading. When the flash memory 10 is embedded on the same chip as the CPU 210 as shown in FIG. 27, the flash memory 10 can be used as a ROM for storing firmware or the like for the CPU 210. Since the operating speed of the flash memory 10 is fast, the CPU 210 can read data directly without using a RAM or the like, which makes a RAM unnecessary and therefore improves the operating speed of the system LSI. The flash memory 10 can be formed in the same manufacturing processes as those of the flash memory 220 and NAND flash memory 230. For example, the ion implantation process for forming impurity diffused layers and the process of patterning gate electrodes and metal wiring layers can be carried out on three types of flash memories. In this case, for example, the impurity diffused layers have the same concentration between the individual memories. As described above, since the three flash memories provided in an LSI can be formed in the same processes, the manufacture of LSI can be simplified.

Furthermore, for example, the CPU 210 may be formed on an SOI substrate in the logic circuit region, and each of the memories 10, 220, 230 may be formed on a bulk silicon substrate in the memory region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    memory cells each of which includes a first MOS transistor with a stacked gate including a floating gate formed on a first well region formed at the surface of a semiconductor substrate with a gate insulating film interposed therebetween and a control gate formed on the floating gate with an inter-gate insulating film interposed therebetween, and a second MOS transistor having a drain connected to a source of the first MOS transistor;
    a memory cell array which has the memory cells arranged in a matrix;
    word lines each of which connects in common control gates of the first MOS transistors in a same row;
    select gate lines each of which connects in common gates of the second MOS transistors in a same row;
    a first row decoder which, in a write operation, selects any one of the word lines, applies a positive potential to the selected word line and applies a negative potential to the first well region, and after the write operation, brings the selected word line and the first well region into a floating state;
    a second row decoder which selects any one of the select gate lines in a read operation; and
    a control circuit which short-circuits the selected word line and first well region in the floating state, the select gate lines being connected to a negative potential node in a write operation, and after the write operation, the select gate lines being isolated from the negative potential node and connected to the first well region.

2. The semiconductor memory device according to claim 1, wherein the first row decoder includes:
    an address decode circuit which is provided for each of the word lines and which decodes a row address signal and, in a write operation, applies a positive potential to the selected word line;
    a first switch element which connects a positive potential power supply node of the address decode circuit to a positive potential node;
    a second switch element which connects the positive potential power supply node of the address decode circuit to the control circuit; and
    a third switch element which connects a negative potential power supply node of the address decode circuit to a ground potential node, and
    in the write operation, the first switch element connects the selected word line to the positive potential node via the positive potential power supply node of the corresponding address decode circuit and the third switch element connects the unselected word line to the ground potential node via the negative potential power supply node of the corresponding address decode circuit, and
    after the write operation, the first to third switch elements bring not only the positive potential power supply node and the negative potential power supply node of the address decode circuit into an open state to bring the selected word line into a floating state, and
    after the selected word line is brought into the floating state, the second switch element connects the selected word line to the control circuit via the positive potential power supply node of the corresponding address decode circuit.

3. The semiconductor memory device according to claim 2, further comprising:
   a fourth switch element which, in the write operation, connects the first row decoder to the control circuit to apply the negative potential supplied from the control circuit to the first well region via the first row decoder, after the write operation, disconnects the first row decoder from the control circuit to bring the first well region into the floating state and, after the first well region is brought into the floating state, connects the first row decoder to the control circuit to connect the control circuit and the first well region electrically; and
   a fifth switch element which, when the fourth switch element applies the negative potential to the first well region, connects the select gate line to the negative potential node and, when the first well region in the floating state is connected to the control circuit electrically, disconnects the select gate line from the negative potential node and connects the select gate line to the first well region.

4. The semiconductor memory device according to claim 3, wherein the first row decoder includes:
   a third MOS transistor which is formed, for each of the select gate lines, on a second well region formed at the surface of the semiconductor substrate and isolated from the first well region, and which has one end of its current path connected to the fifth switch element and the other end of its current path connected to the select gate line; and
   a sixth switch element which connects a negative potential power supply node of the address decode circuit to the control circuit, and
   the third switch element further connects the negative potential power supply node of the address decode circuit to a negative potential node, and
   in an erase operation, the third switch element connects the word line to the negative potential node via the negative potential power supply node of the corresponding address decode circuit, the fourth switch element connects the first row decoder to the control circuit to apply a positive potential supplied from the control circuit to the first well region via the first row decoder, and the third MOS transistor is turned off, and
   after the erase operation, the first to fourth switch elements and the sixth switch element are turned off to bring the word lines and the first well region into the floating state, and the third MOS transistor is in a off state, and
   after the word lines and the first well region are brought into the floating state, the sixth switch element connects the word lines to the control circuit via the negative potential power supply node of the corresponding address decode circuit and the fourth switch element connects the first well region to the control circuit, and the third MOS transistor is in the off state.

5. The semiconductor memory device according to claim 1, further comprising:
   bit lines each of which connects in common drains of the first MOS transistors in a same column electrically; and
   a source line which connects in common sources of the second MOS transistors.

6. The semiconductor memory device according to claim 5, wherein each of the memory cells further includes a fourth MOS transistor which has a source connected to the drain of the first MOS transistor and a drain connected to the bit line.

7. A semiconductor memory device comprising:
   memory cells each of which includes a first MOS transistor with a stacked gate including a floating gate formed on a well region formed at the surface of a semiconductor substrate with a gate insulating film interposed therebetween and a control gate formed on the floating gate with an inter-gate insulating film interposed therebetween, and a second MOS transistor having a drain connected to a source of the first MOS transistor;
   a memory cell array which has the memory cells arranged in a matrix;
   word lines each of which connects in common the control gates of the first MOS transistors in a same row;
   select gate lines each of which connects in common the gates of the second MOS transistors in a same row;
   a first row decoder which, in a write operation, selects any one of the word lines, applies a positive potential to the selected word line and applies a negative potential to the well region, and after the write operation, brings the selected word line, the well region, and the select gate line into a floating state;
   a second row decoder which selects any one of the select gate lines in a read operation; and
   a control circuit which short-circuits the word line, select gate line, and well region in the floating state.

8. The semiconductor memory device according to claim 7, wherein the first row decoder includes:
   an address decode circuit which is provided for each of the word lines and which decodes a row address signal and, in a write operation, applies a positive potential to the selected word line;
   a first switch element which connects a positive potential power supply node of the address decode circuit to a positive potential node;
   a second switch element which connects the positive potential power supply node of the address decode circuit to the control circuit; and
   a third switch element which connects a negative potential power supply node of the address decode circuit to a ground potential node, and
   in the write operation, the first switch element connects the selected word line to the positive potential node via the positive potential power supply node of the corresponding address decode circuit and the third switch element connects the unselected word line to the ground potential node via the negative potential power supply node of the corresponding address decode circuit, and
   after the write operation, the first to third switch elements bring the positive potential power supply node and the negative potential power supply node of the address decode circuit into an open state to bring the selected word line into a floating state, and
   after the selected word line is brought into the floating state, the second switch element connects the selected word line to the control circuit via the positive potential power supply node of the corresponding address decode circuit.

9. The semiconductor memory device according to claim 8, further comprising:
   a fourth switch element which, in the write operation, connects the first row decoder to the control circuit to apply the negative potential supplied from the control circuit to the well region via the first row decoder, after the write operation, disconnects the first row decoder from the control circuit to bring the well region into the floating state and, after the well region is brought into the floating state, connects the first row decoder to the control circuit to connect the control circuit and the well region electrically, wherein the first row decoder further includes a third MOS transistor which is formed on the well region for each of the select gate lines, which has one end of its current path connected to the well region and the other end of its current path connected to the select gate line, and which is turned on in the write operation.

10. The semiconductor memory device according to claim 9, wherein the first row decoder further includes a fifth switch element which connects the negative potential power supply node of the address decode circuit to the control circuit, the third switch element further connects the negative potential power supply node of the address decode circuit to a negative potential node, and in an erase operation, the third switch element connects the word line to the negative potential node via the negative potential power supply node of the corresponding address decode circuit, the fourth switch element connects the first row decoder to the control circuit to apply a positive potential supplied from the control circuit to the well region via the first row decoder, and the third MOS transistor is turned off, and after the erase operation, the first to fifth switch elements are turned off to bring the word lines and the well region into the floating state and the third MOS transistor is in a off state, and after the word lines and the well region are brought into the floating state, the fifth switch element connects the word lines to the control circuit via the negative potential power supply node of the corresponding address decode circuit, the fourth switch element connects the well region to the control circuit, and the third MOS transistor is in the off state.

11. The semiconductor memory device according to claim 7, further comprising:

bit lines each of which connects in common drains of the first MOS transistors in a same column electrically; and a source line which connects in common sources of the second MOS transistors.

12. The semiconductor memory device according to claim 11, wherein each of the memory cells further includes a fourth MOS transistor which has a source connected to the drain of the first MOS transistor and a drain connected to the bit line.

13. A semiconductor memory device comprising:

memory cells each of which includes a first MOS transistor with a stacked gate including a floating gate formed on a first well region formed at the surface of a semiconductor substrate with a gate insulating film interposed therebetween and a control gate formed on the floating gate with an inter-gate insulating film interposed therebetween, and a second MOS transistor which has a drain connected to a source of the first MOS transistor;

a memory cell array which has the memory cells arranged in a matrix;

word lines each of which connects in common the control gates of the first MOS transistors in a same row;

select gate lines each of which connects in common the gates of the second MOS transistors in a same row;

a first row decoder which, in an erase operation, applies a negative potential to the word lines, applies a positive potential to the first well region, and brings the select gate lines into a floating state, and after the erase operation, brings the word lines, the first well region, and the select gage lines into a floating state;

a second row decoder which selects any one of the select gate lines in a read operation; and a control circuit which short-circuits the word lines and first well region in the floating state.

14. The semiconductor memory device according to claim 13, wherein the first row decoder includes:

an address decode circuit which is provided for each of the word lines and which decodes a row address signal and, in an erase operation, applies a negative potential to the word lines;

a first switch element which connects a positive potential power supply node of the address decode circuit to a positive potential node;

a second switch element which connects the negative potential power supply node of the address decode circuit to a negative potential node; and a third switch element which connects the negative potential power supply node of the address decode circuit to the control circuit, in an erase operation, the second switch element connects the word line to the negative potential node via the negative potential power supply node of the corresponding address decode circuit, after the erase operation, the first to third switch elements bring the positive potential power supply node and negative potential power supply node of the address decode circuit into an open state to bring the word lines into a floating state, and after the word lines are brought into the floating state, the third switch element connects the word line to the control circuit via the negative potential power supply node of the corresponding address decode circuit.

15. The semiconductor memory device according to claim 14, further comprising:

a fourth switch element which, in an erase operation, connects the first row decoder to the control circuit to apply the positive potential supplied from the control circuit to the first well region via the first row decoder, after the erase operation, disconnects the first row decoder from the control circuit to bring the first well region into the floating state and, after the first well region is brought into the floating state, connects the first row decoder to the control circuit to connect the control circuit and the first well region electrically.

16. The semiconductor memory device according to claim 15, wherein the first row decoder further includes:

a third MOS transistor which is formed, for each of the select gate lines, on a second well region formed at the surface of the semiconductor substrate and isolated from the first well region and which has one end of its current path connected to the select gate line; and a fifth switch element which connects the positive potential power supply node of the address decode circuit to the control circuit, the device further includes a sixth switch element which switches the connection of the other end of the current path of the third MOS transistor to either the first well region or the negative potential node, the second switch element further switches the connection between the negative potential power supply node of the address decode circuit and a ground potential node, and in a write operation, the first switch element connects the selected word line to the positive potential node via the positive potential power supply node of the corresponding address decode circuit, the second switch element connects the unselected word line, to the ground potential node via the negative potential power supply node of the corresponding address decode circuit, the fourth switch element connects the first row decoder to the control circuit to apply a negative potential supplied from the control circuit to the first well region via the first row decoder, the third MOS transistor is turned on, and the sixth switch element connects the other end of the current path of the third MOS transistor to the negative potential power supply node, after the write operation, the first to fifth switch elements are turned off to bring the selected word line and the first well region into the floating state, and after the selected word line and the first well region are brought into the floating state, the fifth switch element connects the selected word line to the control circuit via the positive potential power supply node of the corresponding address decode circuit, the fourth switch element connects the first row decode circuit to the control circuit to connect the control circuit and the first well electrically, and the sixth switch element connects the select gate line to the first well region.

17. The semiconductor memory device according to claim 15, wherein the first row decoder further includes:

a third MOS transistor which is formed on the first well region for each of the select gate lines and which has one end of its current path connected to the select gate line; and a fifth switch element which connects a positive potential power supply node of the address decode circuit to the control circuit, the second switch element further switches the connection between the negative potential power supply node of the address decode circuit and a ground potential node, and in an erase operation, the first switch element connects the selected word line to the positive potential node via the positive potential power supply node of the corresponding address decode circuit, the second switch element connects the unselected word lines to the ground potential node via the negative potential power supply node of the corresponding address decode circuit, the fourth switch element connects the first row decoder to the control circuit to apply a negative potential supplied from the control circuit to the first well region via the first row decoder, and the third MOS transistor is turned on, after the write operation, the first to fifth switch elements are turned off to bring the selected word line, the first well region, and the select gate line into the floating state, and after the selected word line is brought into the floating state, the fifth switch element connects the selected word line to the control circuit via the positive potential power supply node of the corresponding address decode circuit and the fourth switch element connects the first row decoder to the control circuit to connect the control circuit and the first well region electrically.

18. The semiconductor memory device according to claim 13, further comprising:

bit lines each which connects in common drains of the first MOS transistors in a same column electrically; and a source line which connects in common sources of the second MOS transistors.

19. The semiconductor memory device according to claim 18, wherein the memory cell further includes a fourth MOS transistor having a source connected to the drain of the first MOS transistor and a drain connected to the bit line.

* * * * *